United States Patent
Kuboi

(10) Patent No.: US 10,929,579 B2
(45) Date of Patent: Feb. 23, 2021

(54) FILM FORMATION SIMULATION METHOD, PROGRAM, AND SEMICONDUCTOR PROCESSING SYSTEM

(71) Applicant: SONY CORPORATION, Tokyo (JP)

(72) Inventor: Nobuyuki Kuboi, Kanagawa (JP)

(73) Assignee: Sony Corporation, Tokyo (JP)

( * ) Notice: Subject to any disclaimer, the term of this patent is extended or adjusted under 35 U.S.C. 154(b) by 298 days.

(21) Appl. No.: 16/067,754

(22) PCT Filed: Oct. 19, 2016

(86) PCT No.: PCT/JP2016/080993
§ 371 (c)(1),
(2) Date: Jul. 2, 2018

(87) PCT Pub. No.: WO2017/122404
PCT Pub. Date: Jul. 20, 2017

(65) Prior Publication Data
US 2019/0005170 A1    Jan. 3, 2019

(30) Foreign Application Priority Data
Jan. 13, 2016 (JP) .............................. JP2016-004259

(51) Int. Cl.
*C23C 16/52* (2006.01)
*C23C 14/54* (2006.01)
*G06F 30/20* (2020.01)

(52) U.S. Cl.
CPC .............. *G06F 30/20* (2020.01); *C23C 14/54* (2013.01); *C23C 16/52* (2013.01)

(58) Field of Classification Search
CPC .......... G06F 30/20; C23C 16/52; C23C 14/54
See application file for complete search history.

(56) References Cited

U.S. PATENT DOCUMENTS

2010/0243431 A1* 9/2010 Kuboi ................ H01J 37/3023
204/192.33

FOREIGN PATENT DOCUMENTS

JP    2000-195766    7/2000

OTHER PUBLICATIONS

Dew et al., "Stimulation of Elevated Temperature Aluminum Metallization Using SIMBAD," IEEE Transactions on Electron Devices, vol. 39, No. 7, Jul. 1992, pp. 1599-1606.
(Continued)

*Primary Examiner* — Elizabeth A Burkhart
(74) *Attorney, Agent, or Firm* — Sheridan Ross P.C.

(57) ABSTRACT

A film formation simulation method that enables prediction of the film quality of a film formed on a macro scale is provided. A film formation simulation method including: calculating a position at which each of raw material particles that enter a film formation surface migrates on the film formation surface, on a basis of an activation energy of a surface of the film formation surface, by using a computing device; calculating information regarding a defect of a film including the raw material particles on the film formation surface, on a basis of migration positions of the raw material particles of a predetermined amount, each time the migration positions of the raw material particles of the predetermined amount are calculated; and calculating an activation energy of a surface of the film including the raw material particles, on a basis of the information regarding the defect of the film. The activation energy of the surface of the film calculated immediately before is used in calculation of the migration position of each of the raw material particles.

20 Claims, 13 Drawing Sheets

(56) References Cited

OTHER PUBLICATIONS

Bogicevic et al., "Island migration caused by the motion of the atoms at the border: Side and temperature dependence of the diffusion coefficient," Physical Review B, 1998, vol. 57, No. 16, pp. R9459-R9462, particularly, Fig, 2.

Zhu et al., "Mulyilayer growth of BaTiO3 thin films via pulsed layer deposition: An energy-dependent kinetic Monte Carlo simulation," Applied Surface Science, 2010, vol. 256, pp. 5876-5881.

International Search Report prepared by the Japan Patent Office dated Jan. 5, 2017, for International Application No. PCT/JP2016/080993.

\* cited by examiner

FILM FORMATION SIMULATION METHOD, PROGRAM, AND SEMICONDUCTOR PROCESSING SYSTEM

CROSS REFERENCE TO RELATED APPLICATIONS

This application is a national stage application under 35 U.S.C. 371 and claims the benefit of PCT Application No. PCT/JP2016/080993 having an international filing date of 19 Oct. 2016, which designated the United States, which PCT application claimed the benefit of Japanese Patent Application No. 2016-004259 filed 13 Jan. 2016, the entire disclosures of each of which are incorporated herein by reference.

TECHNICAL FIELD

The present disclosure relates to a film formation simulation method, a program, and a semiconductor processing system.

BACKGROUND ART

In recent years, there is an increasing need for improvement of properties of semiconductor elements. Here, in order to improve the properties of the semiconductor elements, it is important to appropriately control the coatability and film qualities (for example, density, defect density, permeability, adhesiveness, etc.) of a formed film, by optimizing a film formation process.

Here, various film formation simulation technologies are proposed as the technology for predicting various properties of the formed film.

For example, following Non-Patent Literature 1 discloses a technology for calculating a film formation speed and coatability of the formed film, by solving the adherence position of an entering gas particle on a film formation surface by the Monte Carlo method, by using information regarding the flow rate of the entering gas.

Also, there is a proposal of predicting a film quality of the formed film in a several-nanometer region, by analyzing behavior of atoms one by one in detail, by using the first-principles calculation or molecular dynamics (MD) calculation.

CITATION LIST

Non-Patent Literature

Non-Patent Literature 1: Steve K, Dew, et. al "IEEE TRANSACTIONS ON ELECTRON DEVICES", 1992 vol. 39, No. 7, p. 1599

DISCLOSURE OF INVENTION

Technical Problem

However, in the technology disclosed in Non-Patent Literature 1, it is possible to predict the coatability of the formed film in a micrometer region, but it is difficult to predict the film quality of the formed film. Also, in the analysis using the first-principles calculation or the MD calculation, predicting the film quality of the formed film in the several-micrometer region requires an enormous cost and time, and thus is not realistic.

Thus, there is a need for a film formation simulation method that can predict the film quality of the formed film, in the range of micrometer.

Solution to Problem

According to the present disclosure, there is provided a film formation simulation method including: calculating a position at which each of raw material particles that enter a film formation surface migrates on the film formation surface, on a basis of an activation energy of a surface of the film formation surface, by using a computing device; calculating information regarding a defect of a film including the raw material particles on the film formation surface, on a basis of migration positions of the raw material particles of a predetermined amount, each time the migration positions of the raw material particles of the predetermined amount are calculated; and calculating an activation energy of a surface of the film including the raw material particles, on a basis of the information regarding the defect of the film. The activation energy of the surface of the film calculated immediately before is used in calculation of the migration position of each of the raw material particles.

In addition, according to the present disclosure, there is provided a program for causing a computer to function as: a migration computing unit that calculates a position at which each of raw material particles that enter a film formation surface migrates on the film formation surface, on a basis of an activation energy of a surface of the film formation surface; a morphology computing unit that calculates information regarding a defect of a film including the raw material particles on the film formation surface, on a basis of migration positions of the raw material particles of a predetermined amount, each time the migration positions of the raw material particles of the predetermined amount are calculated by the migration computing unit; and an energy computing unit that calculates an activation energy of a surface of the film including the raw material particles, on a basis of the information regarding the defect of the film. The migration computing unit uses the activation energy of the surface of the film calculated immediately before by the energy computing unit.

In addition, according to the present disclosure, there is provided a semiconductor processing system including: a migration computing unit that calculates a position at which each of raw material particles that enter a film formation surface migrates on the film formation surface, on a basis of an activation energy of a surface of the film formation surface; a morphology computing unit that calculates information regarding a defect of a film including the raw material particles on the film formation surface, on a basis of migration positions of the raw material particles of a predetermined amount, each time the migration positions of the raw material particles of the predetermined amount are calculated; and an energy computing unit that calculates an activation energy of a surface of the film including the raw material particles, on a basis of the information regarding the defect of the film. The migration computing unit uses the activation energy of the surface of the film calculated immediately before by the energy computing unit.

According to the present disclosure, it is possible to calculate the morphology of a film, considering a change of film quality distribution of the film during film formation.

Advantageous Effects of Invention

As described above, according to the present disclosure, it is possible to predict the film quality of the formed film in the range of micrometer.

BRIEF DESCRIPTION OF DRAWINGS

FIG. 3 is used.

FIG. 3 is used.

FIG. 4 is used.

FIG. 4 is used.

MODE(S) FOR CARRYING OUT INVENTION

Figure 1:
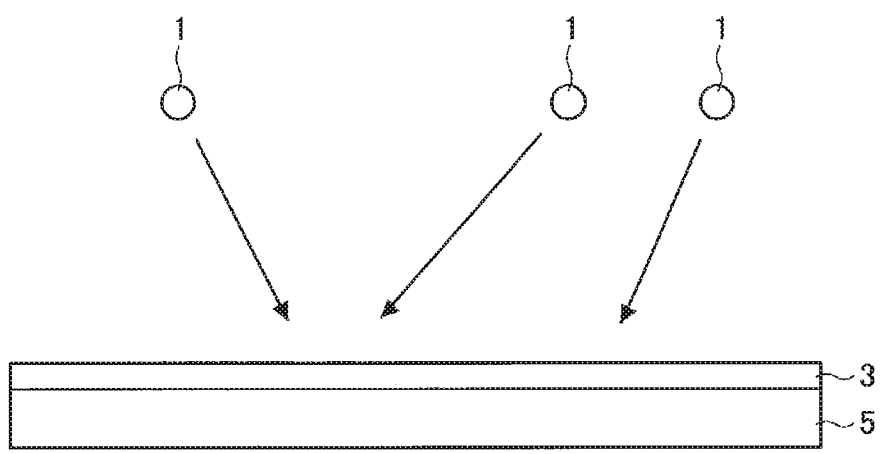
FIG. 1 is an explanatory diagram that describes a film formation method handled by a film formation simulation method according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be made in the following order.
1. First Embodiment
1.1. Overview
1.2. Sequence of Film Formation Simulation Method
1.3. Coordination with Another Simulation
1.4. Specific Example
2. Second Embodiment
2.1. Overview
2.2. Configuration Example of Film Formation Simulation Device
2.3. Hardware Configuration Example
3. Third Embodiment
3.1. Overview
3.2. Configuration Example of Semiconductor Processing System
4. Conclusion

1. First Embodiment

1.1. Overview

First, with reference to FIG. 1, an overview of a film formation simulation method according to a first embodiment of the present disclosure will be described. FIG. 1 is an explanatory diagram that describes a film formation method handled by the film formation simulation method according to the present embodiment.

As illustrated in FIG. 1, the film formation simulation method according to the present embodiment handles a film formation method that projects raw material particles 1 to a film formation surface of a film formation target 5 in order to form a film 3 including the raw material particles 1.

Specifically, the film formation simulation method according to the present embodiment handles various types of vapor deposition method and predicts film quality distribution of a formed film. The film formation methods that can be handled by the film formation simulation method according to the present embodiment are, for example, a physical vapor deposition method (PVD), such as a resistance heating vapor deposition method, an electron beam deposition method, a molecular beam epitaxy method, an ion plating method, and a sputtering method, a chemical vapor deposition method (CVD), such as a heat or plasma chemical vapor deposition method, an atomic layer deposition method (ALD), a metalorganic chemical vapor deposition method, etc.

The raw material particles 1 are, for example, an atom, a molecule, or an ion generated by ionizing these. The raw material particles 1 may be formed by dissolving or ionizing a raw material gas introduced into a film formation chamber by using heat, plasma, or the like, and may be formed by causing rare gas atoms or the like to collide against a metal target.

Also, the raw material particles 1 may be one type, and may be two or more types. That is, the film 3 may be a film formed of a single raw material, and may be a film formed by reacting a plurality of raw materials.

The film formation target 5 is, for example, a metal substrate, a semiconductor substrate, a glass substrate, a quartz substrate, a plastic substrate, or the like. The shape and material of the surface of the film formation surface of the film formation target 5 are not limited particularly. For example, on the film formation surface of the film formation target 5, a thin film may be formed, and a fine structure may be formed.

The film 3 formed on the film formation target 5 is a thin film of a film thickness of approximately several micrometers, for example. Also, the size of a region that can be handled in the film formation simulation method according to the present embodiment is a region having a side length of approximately several micrometers, for example.

The film formation simulation method according to the present embodiment can predict a micro property, such as density, defect density, permeability, etc. of the formed film 3, in the range of several micrometers, in the above film formation method.

1.2. Sequence of Film Formation Simulation Method

Figure 2:
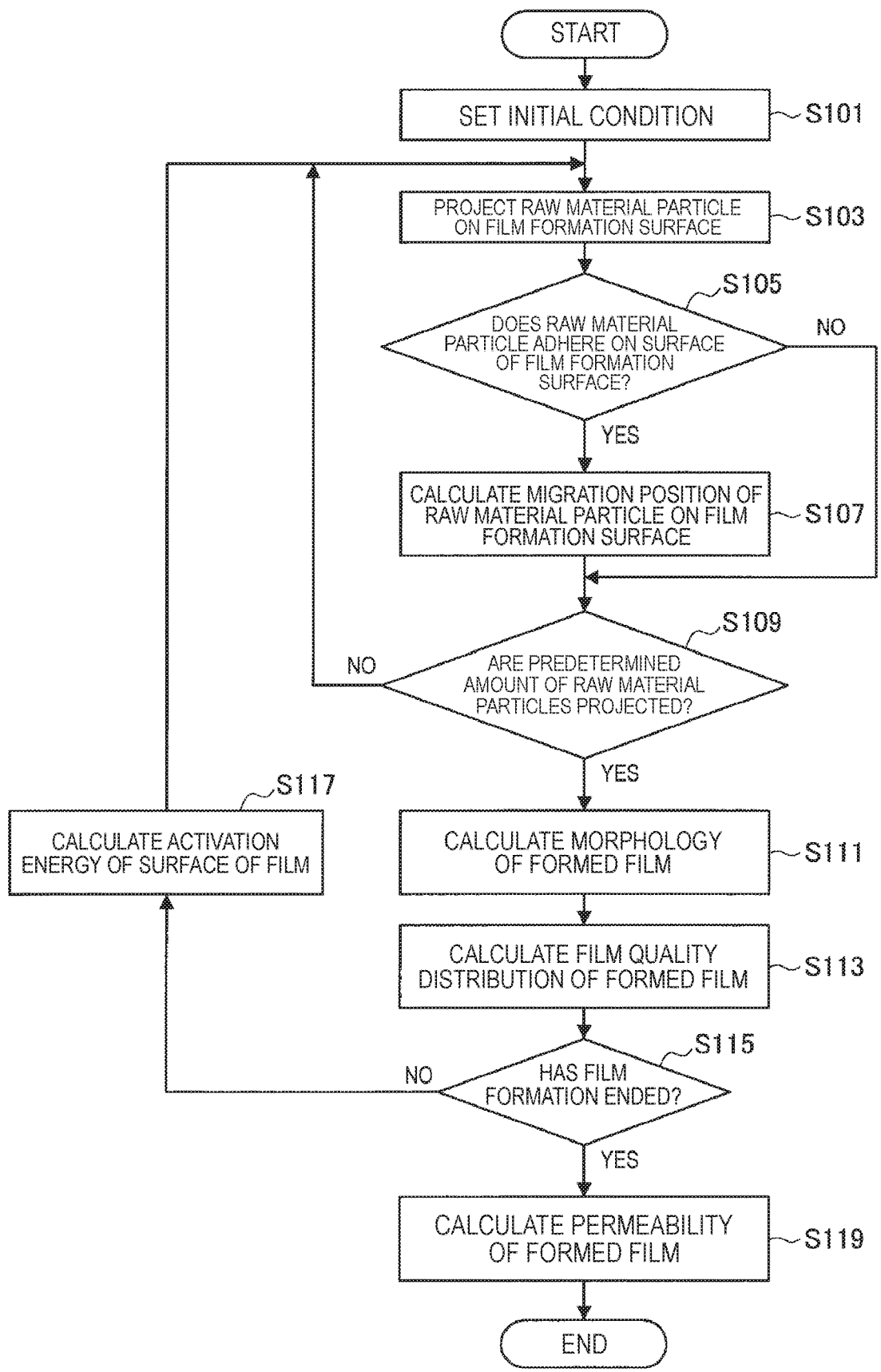
FIG. 2 is a flowchart diagram illustrating a sequence of a film formation simulation method according to this embodiment.

Next, a sequence of the film formation simulation method according to the present embodiment will be described with reference to FIG. 2. FIG. 2 is a flowchart diagram illustrating the sequence of the film formation simulation method according to the present embodiment.

First, an initial condition of film formation is set, as illustrated in FIG. 2 (S101). Specifically, the initial condition of film formation includes information regarding a film formation condition and information regarding the film formation surface, etc. The information regarding the film formation condition is information of a film formation method, a film formation temperature, an applied power, a film formation pressure, a film formation time, and a film formation speed at the time of film formation, for example, and the information regarding the film formation surface is information of a material and a shape of the film formation surface, for example.

For example, when the film formation method is the vapor deposition method using a gas as a raw material, a gas species, a gas flux amount, a film formation temperature, an applied power, a film formation pressure, a film formation time, etc. at the time of film formation may be set as the information regarding the film formation condition, in S101. Also, the material and shape of the film formation surface may be set as the information regarding the film formation surface.

Also, as described later, in the film formation simulation method according to the present embodiment, the morphology, the film quality distribution, etc. of the formed film are calculated, each time the raw material particles of a predetermined amount is projected on the film formation surface, as the film formation progresses. Thus, in S101, a time step for calculating the morphology, the film quality distribution, etc. of the formed film as the initial condition may be set.

Next, the raw material particles are imaginarily projected on the film formation surface (S103). The projection directions and the projection positions of the raw material particles are decided by using the Monte Carlo method, for example. Note that, when the film formation method is an isotropic film formation method (for example, CVD, etc.), the projection directions of the raw material particles are decided at random. Also, when the film formation method is an anisotropic film formation method (for example, PVD, etc.), the projection directions of the raw material particles are decided to have a directional property based on the film formation direction. For example, the projection directions of the raw material particles may be decided to have a Gaussian distribution having a center value at the vertical direction to the film formation surface.

Subsequently, it is determined whether or not the raw material particles projected on the film formation surface adhere on the film formation surface (S105). The projected raw material particles adhere on the film formation surface with a predetermined adherence probability (S105/Yes). Note that the raw material particles that do not adhere are reflected by the surface of the film formation surface (S105/No), and thus do not contribute to the film formation. The adherence probability of the raw material particle on the film formation surface is appropriately set on the basis of the type and the projection speed of the raw material particle, the material and the reactivity of the film formation surface, and the like, but may be set within the range of 0.1 or more and 1.0 or less, for example, for example.

Next, the migration positions of the raw material particles that have adhered on the film formation surface are calculated (S107). The raw material particles that have adhered on the film formation surface migrate on the surface of the film formation surface, and thereafter form the film at an ultimate adherence position. As described above, the raw material particles adhere on the surface of the film formation surface one after another and are deposited, and thereby the film is formed on the film formation surface.

Figure 3:
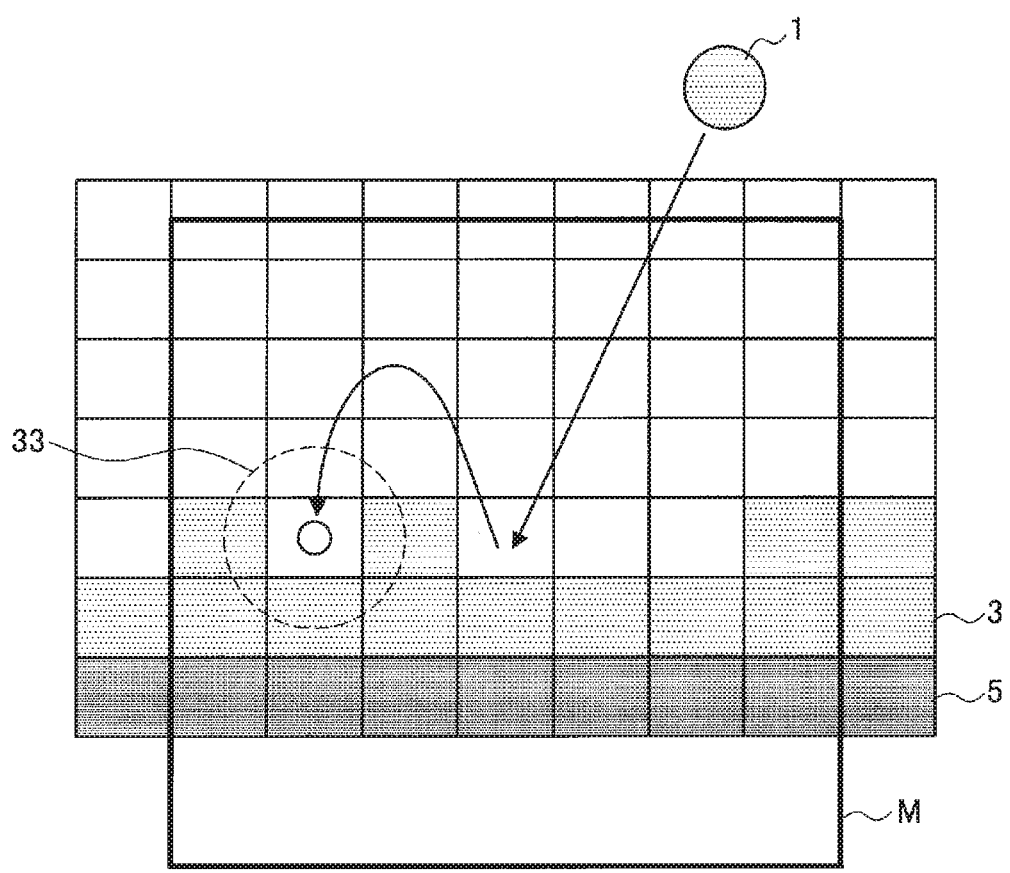
FIG. 3 is an explanatory diagram that illustrates a first calculation method of a migration position of a raw material particle.
Figure 4:
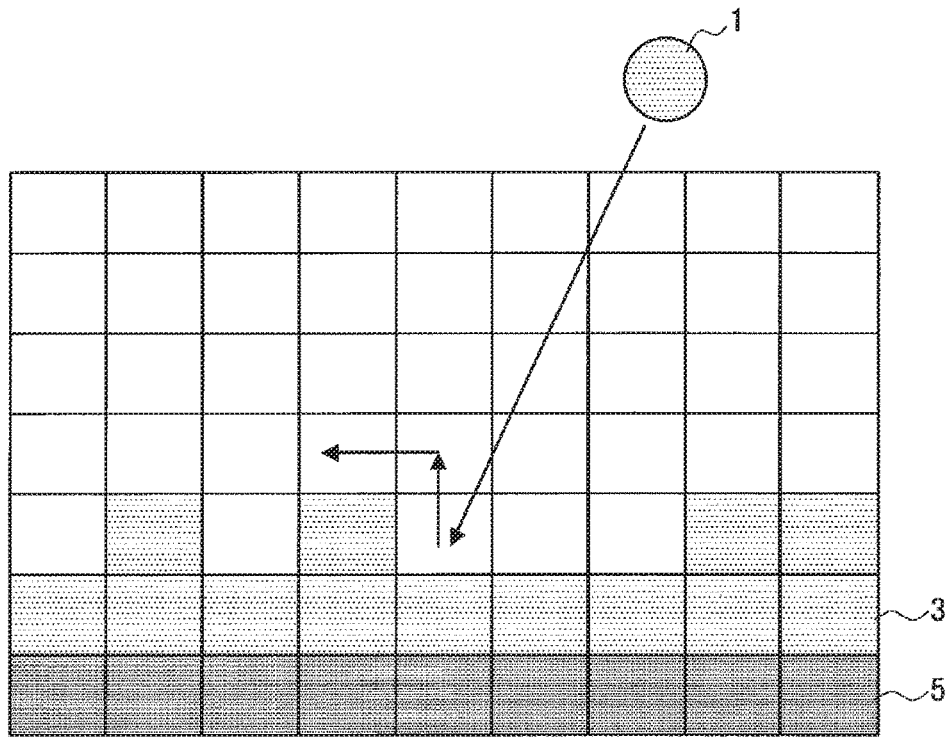
FIG. 4 is an explanatory diagram that illustrates a second calculation method of a migration position of a raw material particle.

Here, a calculation method of the migration positions of the raw material particles on the film formation surface will be described specifically, with reference to FIGS. 3 and 4. FIG. 3 is an explanatory diagram that illustrates a first calculation method of the migration position of the raw material particle. Moreover, FIG. 4 is an explanatory diagram that illustrates a second calculation method of the migration position of the raw material particle.

In the film formation simulation method according to the present embodiment, a mode (also referred to as morphology) of the formed film is modeled and expressed by using cells of various shapes. Specifically, the morphology of the film 3 on the film formation target 5 can be expressed with a two-dimensional voxel model, as illustrated in FIGS. 3 and 4. Note that the morphology of the film 3 can be modeled and expressed with cells of other shapes. For example, the morphology of the film 3 may be expressed by a model that uses polygonal or circular cells. Also, the morphology of the film 3 can be expressed three-dimensionally, and in such a case, may be expressed by a model that uses cells having spherical shapes or cube shapes.

Referring to FIG. 3, in the first calculation method, first, a region M that the raw material particle 1 migrates into is set, and the position at which the raw material particle 1 ultimately adheres on the surface of the film 3 is decided by using the Monte Carlo method in the region M.

The region M is a region having the length of L in the in-plane direction of the film formation surface and centered at the position at which the raw material particle 1 enters. L is a value that depends on activation energy Ea and film formation temperature T of the film formation surface that the raw material particle 1 enters, and is decided by following equation 1, for example.

[Math. 1]

$$L = \sqrt{D_0 \tau} \times e^{-E_a/2k_B T} \quad \text{Equation 1}$$

In equation 1, $D_0$ is a diffusion constant, and $\tau$ is a diffusion time, and $k_B$ is a Boltzmann constant. Note that the activation energy Ea is influenced by the surface state of the formed film 3, and thus as described later, is recalculated in consideration of the film quality distribution of the film 3, each time the film quality distribution of the film 3 is calculated.

Specifically, in the first calculation method, it is first determined whether or not a concave surface position 33 exists in the region M that the raw material particle 1 migrates into. When the concave surface position 33 exists, it is determined that the concave surface position 33 is the position at which the raw material particle 1 adheres ultimately. Also, when a plurality of concave surface positions 33 exist, it is determined that the concave surface position 33 closest from the position at which the raw material particle 1 enters is the position at which the raw material particle 1 adheres ultimately.

On the other hand, when the concave surface position 33 does not exist, it is determined that a surface position selected at random in the region M is the position at which the raw material particle 1 adheres ultimately. Note that the selection of the surface position may utilize weighting according to the distance from the position that the raw material particle 1 enters.

Referring to FIG. 4, in the second calculation method, the position at which the raw material particle 1 adheres ultimately on the surface of the film 3 is decided by moving the raw material particle 1 on the surface of the film 3 at random until the energy that the raw material particle 1 has becomes equal to or smaller than a threshold value.

Specifically the raw material particle 1 experiences an energy change expressed by following equation 2, and reduces the energy, each time the raw material particle 1 moves on the surface of the film 3. Here, it is determined that the position at which the energy E that the raw material particle 1 has becomes equal to or smaller than the threshold value is the position at which the raw material particle 1 adheres ultimately.

[Math. 2]

$$E = E_0 + \Sigma_j^n (k_B T \times j) - \Sigma_j^n E_a(j) \qquad \text{Equation 2}$$

In equation 2, $E_0$ is the initial energy that the raw material particle 1 has when entering the film formation surface, and j is the number of times when the raw material particle 1 moves on the surface of the film formation surface. Also, $E_a$ is the activation energy of the film formation surface that the raw material particle 1 enters, likewise equation 1, and T is the film formation temperature, and $k_B$ is the Boltzmann constant. That is, the second term of equation 2 indicates the energy received by the raw material particle 1 from the surrounding environment on the basis of the film formation temperature T, and the third term indicates the energy lost by the raw material particle 1 by the activation energy $E_a$ of the film formation surface.

In S107, the migration position of the raw material particle can be calculated by using the above first or second calculation method.

Subsequently, it is determined whether or not a predetermined amount of raw material particles are projected on the film formation surface (S109), and when the predetermined amount of raw material particles are projected on the film formation surface (S109/Yes), the mode (also referred to as morphology) of the film formed of the projected raw material particles is calculated (S111). The determination of whether or not the predetermined amount of raw material particles are projected on the film formation surface (S109) may be conducted by determining whether or not the number $F_1$ of the projected raw material particles exceeds the value ($F_0 \times dt$) obtained by multiplying a gas flux amount $F_0$ per unit time by a time step dt for calculating the morphology of the film, for example.

In the calculation (S111) of the morphology of the film, information regarding a defect (also referred to as void) of the film formed by the projected raw material particles is calculated. The raw material particles projected on the film formation surface migrate on the surface of the film formation surface, and thus the film formed of the raw material particles grows unevenly, not evenly. Thus, the film formed of the raw material particles has a structure including air gaps. Thus, in the calculation (S111) of the morphology of the film, the void width distribution of the film can be calculated, by calculating the structure of the film formed of the raw material particles, on the basis of the migration positions of the raw material particles on the film formation surface which are calculated in S107.

Figure 5:
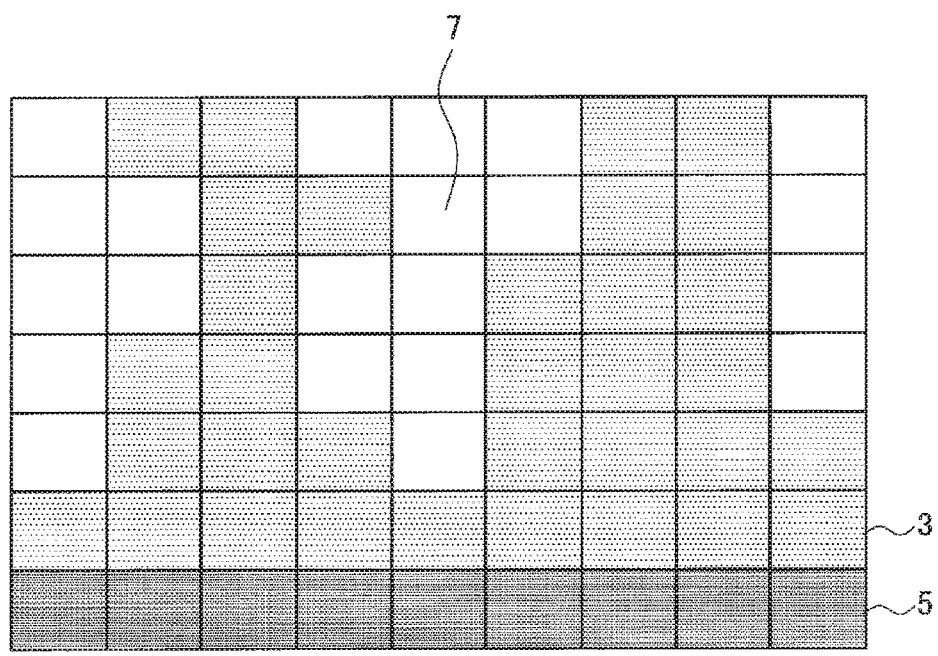
FIG. 5 is an explanatory diagram that expresses a morphology of a film or film formation target, with a two-dimensional voxel model.

Here, with reference to FIG. 5, the morphology of the film will be described in more detail. FIG. 5 is an explanatory diagram that expresses the morphology of the film 3 on the film formation target 5 with the two-dimensional voxel model.

As illustrated in FIG. 5, the raw material particles 1 projected on the film formation surface migrate on the surface of the film formation surface, and thus the film 3 on the film formation target 5 grows unevenly, so as to form a void 7 that is an air gap. In S111, a void width distribution indicating the size and the distribution of the voids 7 formed in the film 3 is calculated as the morphology of the film 3.

Specifically, the void structure of the film 3 illustrated in FIG. 5 is calculated, by calculating information indicating the material (which one of air gap, film, and film formation target) of each cell, and adjacence information indicating other cells adjacent, on the basis of the migration position of each of the raw material particles. Further, by combining the void structure of the film formation surface calculated in the calculation step immediately before and the calculated void structure, the void structure of the entire film 3 is calculated, and the void width distribution of the film 3 is calculated.

Subsequently, the film quality distribution of the film formed of the raw material particles is calculated, on the basis of the morphology (for example, the void width distribution) of the film calculated by S111 (S113). Specifically, the film quality distribution indicates at least one of the density distribution and the defect density distribution of the film formed of the raw material particles. For example, the density or the defect density of the film is calculated on the basis of the void width of the film calculated by S111, and thus the density distribution or the defect density distribution of the film can be calculated, by performing such calculation of the density or the defect density of the film, with respect to the entire film.

Specifically, the density of the film can be calculated by using the size of the void of the film calculated by S111, the composition of the raw material particles, and the film formation temperature. Also, the defect density of the film can be calculated by using the size of the void of the film calculated by S111, the composition of the raw material particles, the film formation temperature, and the information (material and shape) regarding the film formation target.

Note that the density or the defect density of the film may be defined in advance by a function or a database using the above information as variables, so that the above information is assigned to derive the corresponding density or defect density of the film. As described above, the calculation amount executed in the film formation simulation method according to the present embodiment can be decreased, by defining in advance the function or the database for deriving the density or the defect density of the film. The function or the database for deriving the density or the defect density of the film can be defined in advance, by using approximation from an actual measured value, first-principles calculation, or MD calculation, for example.

Here, it is determined whether or not the imaginary film formation has ended, by determining whether or not the film formation time set in the initial condition has elapsed (S115). If the film formation has not ended (S115/No), the activation energy of the surface of the film is recalculated (S117).

In the calculation (S117) of the activation energy of the surface of the film, the activation energy of the surface of the film is recalculated on the basis of the film quality distribution of the film calculated by S113. Specifically, the activation energy of the surface of the film is a parameter that changes on the basis of the defect density distribution of the film, and the activation energy becomes higher as the defect density of the film becomes higher.

Thus, each time the predetermined amount of raw material particles are projected, the film quality distribution of the formed film is calculated, and the value of the activation energy of the surface of the film is updated on the basis of the calculated film quality distribution, and thereby the migration positions of the raw material particles can be calculated in further consideration of the surface state of the film formation surface. Thereby, the calculation accuracy of the migration positions of the calculated raw material particles is improved, and the void structure of the film is calculated more accurately, and thus the calculation accuracy of the film quality distribution of the film is improved.

If the imaginary film formation has ended (S115/Yes), the permeability of the entire film formed of the raw material particles is calculated (S119). Moisture or the like enters into a minute air gap that exists in the formed film, and thereby permeates into the film. Thus, the permeability of the formed film can be calculated, by using the void width distribution of the film formed. For example, the permeability of the film can be calculated by using the void width distribution of the film calculated in S113, the composition of the raw material particles, and the film formation temperature.

According to the sequence described above, the film formation simulation method according to the present embodiment can calculate the film quality distribution of the density distribution, the defect density distribution, the permeability, etc. of the formed film. Also, the film formation simulation method according to the present embodiment does not analyze the behavior of the atoms one by one, but calculates the behavior of the atoms by using the macro parameters of the film formation condition or the like, and thus the film quality of the formed film can be predicted in the range of several micrometers, without necessitating the enormous calculation amount and time.

Also, the film formation simulation method according to the present embodiment recalculates the activation energy of the surface of the film at a predetermined time step, and performs the simulation by using the activation energy recalculated immediately before. Thereby, the accuracy of the activation energy of the film formation surface that is used in the calculation of the migration positions of the raw material particles is improved, and thereby the void structure of the formed film can be predicted with higher accuracy.

Note that, in the above, the number of types of the raw material particles is not mentioned particularly, but the raw material particles may be one type and may be two or more types. For example, when the film formation method is a vapor deposition method using gas as the raw material, the raw material gas may be one type and may be two or more types. Also, when the film formation method is a sputtering method, it may be a usual sputtering method that uses a metal target, and may be a reactive sputtering method that uses a metal target and a reactive gas.

When the raw material particles are two or more types, the initial condition of film formation further includes information regarding the composition ratio of the raw material particles. Also, with regard to the adherence probability between the raw material particles and the film formation surface, and the activation energy, a value is prepared for each type of the raw material particles, and the migration position of the raw material particle of each type on the film formation surface is calculated separately.

1.3. Coordination with Another Simulation

Figure 6:
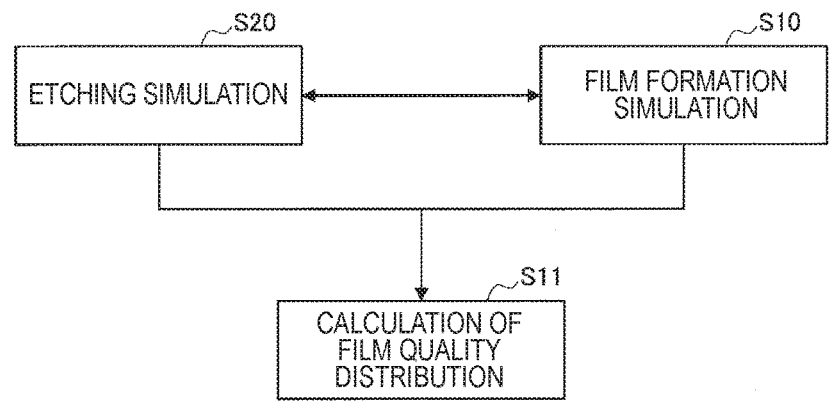
FIG. 6 is an explanatory diagram illustrating an example of coordination between a film formation simulation method according to this embodiment and another simulation method.

Next, coordination between the film formation simulation method according to the present embodiment and another simulation method will be described with reference to FIG. 6. FIG. 6 is an explanatory diagram illustrating an example of the coordination between the film formation simulation method according to the present embodiment and another simulation method.

The film formation simulation method according to the present embodiment can predict the film quality distribution of the film over a plurality of production processes, by being executed and coordinated with another process simulation. Specifically, the film formation simulation method according to the present embodiment can receive and send the information regarding the film model, from/to the process simulation that uses the same film model. Thereby, the simulation can be performed in consideration of the film quality distribution, etc. of the film of the film formation surface, by receiving and sending the information regarding the film model, and thus the film quality distribution of the processed film can be predicted more accurately.

For example, if it is between simulations that models the film structure by the two-dimensional voxel model as illustrated in FIGS. 3 to 5, the information is received and sent between the film formation simulation (S10) according to the present embodiment and the etching simulation (S20) as illustrated in FIG. 6, in order to perform the calculation of the film quality distribution (S11).

Thereby, for example, when the film formation is performed on the etched surface after etching, the damage to the film formation surface by the etching can be considered in the calculation of the film quality distribution of the formed film. Also, for example, when the formed film is etched after the film formation, how the film quality distribution of the film changes by the etching can be predicted from the film quality distribution of the film at the time of film formation.

Note that the etching simulation method that can be executed and coordinated with the film formation simulation method according to the present embodiment is, for example, the plasma etching simulation method disclosed in "Kuboi et al., Journal of Vacuum Science and Technology A 33, 061308 (2015)".

Further, the film formation simulation method according to the present embodiment can be executed and coordinated with other film formation simulations, other than the etching simulation, for example. Thereby, the film quality distribution of the film of the film formation surface can be considered in the calculation of the film quality distribution of the formed film.

1.4. Specific Example

Next, first to fourth specific examples of the film formation simulation method according to the present embodiment will be described with reference to FIGS. 7A to 12B.

First Specific Example

First, the first specific example will be described with reference to FIGS. 7A to 8B. The first specific example is an example that predicts the morphology and the film quality distribution of the film, when a flat film including SiN is formed by using the CVD.

First, the following initial condition is set. A mixed gas of $SiH_4$ and $N_2$ is used as the raw material gas, and the flux of the gas particles is $10^{17}$ piece/cm$^2$·s. Also, the entrance of the gas particle is set isotropic within the range of ±90° from the vertically downward direction by using a random number of [0, 1]. Further, the film formation temperature is set at 400 K, and the film formation time is set at 10 seconds, and the material of the film formation surface is $SiO_2$. Note that the morphology of the film is modeled by using the two-dimensional voxel model of the size of 1 nm.

After the initial condition is set, the gas particles are imaginarily projected on the film formation surface, and the morphology and the film quality distribution of the film are calculated at time steps of 0.1 seconds. Also, the activation energy of the surface of the film formation surface is recalculated on the basis of the calculation result, and the subsequent calculation of the migration position of the gas particle is performed in consideration of the recalculated value of the activation energy.

Figure 7A:
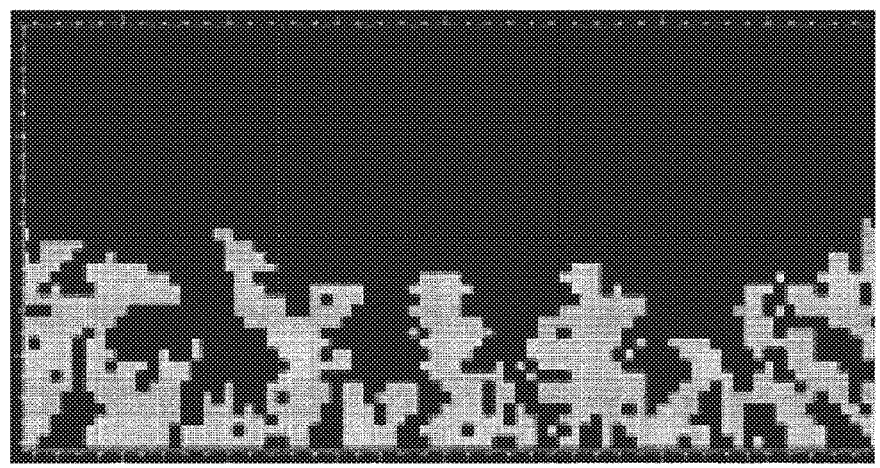
FIG. 7A is an image illustrating a simulation result when a first calculation method described by using
Figure 7B:
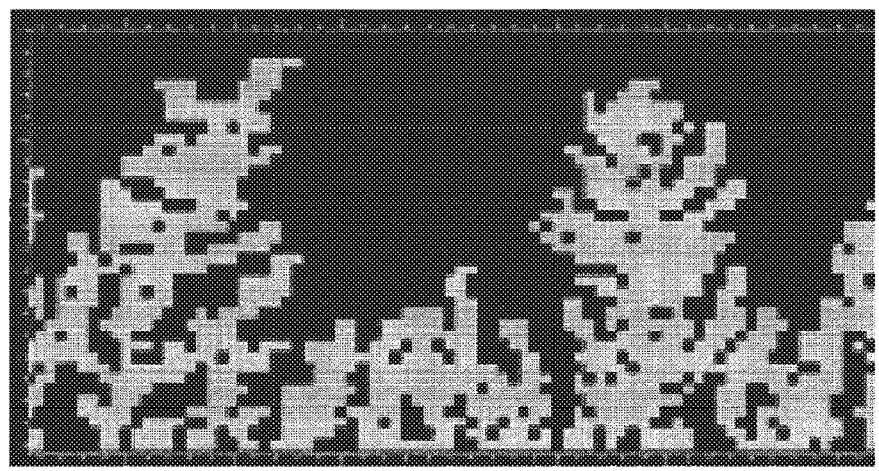
FIG. 7B is an image illustrating a simulation result when a first calculation method described by using

The result obtained by calculating the migration position of the gas particle by using the first calculation method described in FIG. 3 is illustrated in FIGS. 7A and 7B. FIGS. 7A and 7B are the images indicating the simulation result when the first calculation method described in FIG. 3 is used. Note that FIG. 7A and FIG. 7B differ in the adherence probability to the film formation surface. Specifically, FIG. 7A is the simulation result when the adherence probability is 0.5, and FIG. 7B is the simulation result when the adherence probability is 0.9.

As illustrated in FIGS. 7A and 7B, the morphology of the formed SiN film is predicted, by using the film formation simulation method according to the present embodiment. Also, it is known that the gas particle more easily diffuses on the surface of the film formation surface in FIG. 7A in which the adherence probability is lower, and thus the morphology of the smaller void width is formed. Also, the film density, the defect density, and the permeability of the SiN film can be calculated from the morphology of the SiN film, by referring to the database derived by using the first-principles calculation and the MD calculation.

Figure 8A:
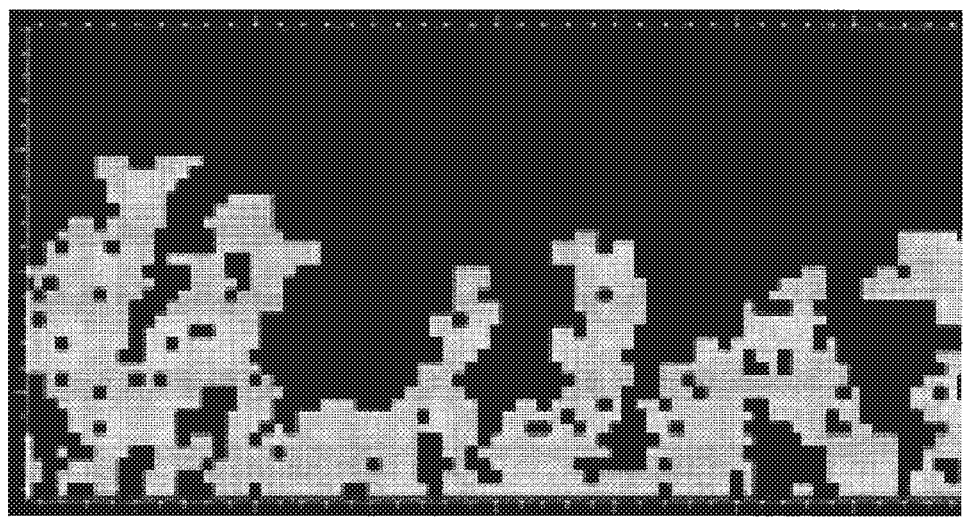
FIG. 8A is an image illustrating a simulation result when a second calculation method described by using
Figure 8B:
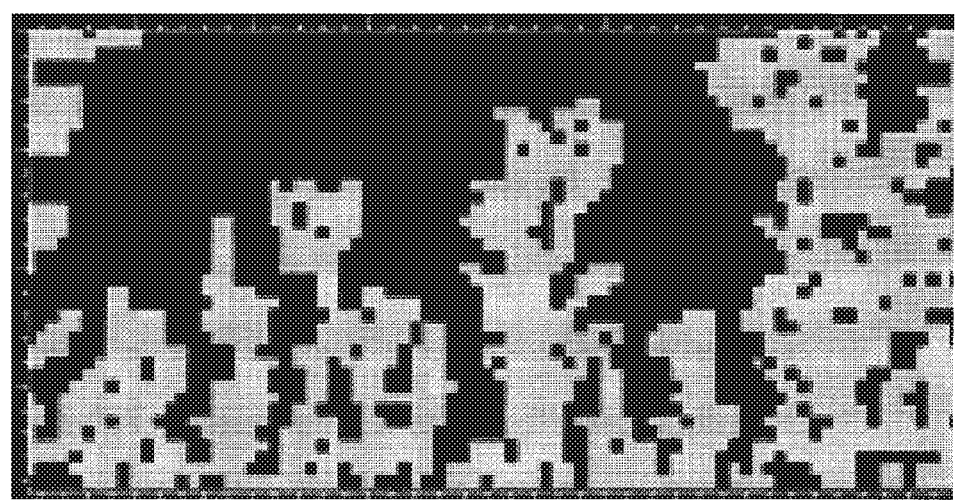
FIG. 8B is an image illustrating a simulation result when a second calculation method described by using

Also, the result obtained by calculating the migration positions of the gas particles by using the second calculation method described in FIG. 4 is illustrated in FIGS. 8A and 8B. FIGS. 8A and 8B are the images indicating the simulation result when the second calculation method described in FIG. 4 is used. Note that FIG. 8A and FIG. 8B differ in the adherence probability to the film formation surface. Specifically, FIG. 8A is the simulation result when the adherence probability is 0.5, and FIG. 8B is the simulation result when the adherence probability is 0.9.

In the second calculation method, the entering gas particle migrates on the surface of the film formation surface by a random number, and the entering and leaving of the energy is calculated each time the gas particle moves one voxel on the surface of the film formation surface. The energy threshold value for the entering gas particle to end the movement is set to 0.02 eV, and the calculation is performed such that the activation energy $E_a$ at the time of the calculation is approximately 2 eV.

As illustrated in FIGS. 8A and 8B, the morphology of the formed SiN film can be predicted when the second calculation method is used, similarly to when the first calculation method is used. Also, the morphology of a smaller void width is formed in FIG. 8A in which the adherence probability is lower, similarly to the result calculated by the first calculation method. Further, the film density, the defect density, and the permeability of the SiN film can be calculated from the morphology of the SiN film, by referring to the database derived by using the first-principles calculation and the MD calculation, similarly to the first calculation method.

As described above, according to the film formation simulation method according to the present embodiment, the morphology and the film quality of the formed film can be predicted, by using the information regarding the film formation condition and the condition relevant to the film formation surface. Also, the film formation simulation method according to the present embodiment is not limited to the above SiN, but can predict the morphology and the film quality of the formed film, with regard to other film types, such as $SiO_2$ and diamond like carbon (DLC) film similarly.

Second Specific Example

Figure 9:
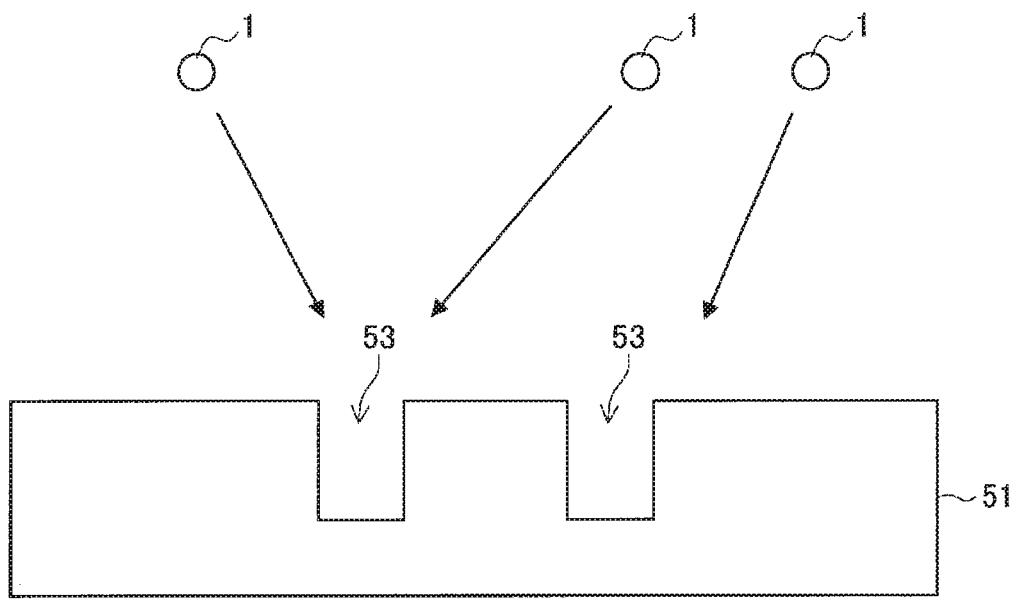
FIG. 9 is an explanatory diagram that describes film formation to a film formation surface on which a fine structure is formed.

Next, a second specific example will be described with reference to FIG. 9. The second specific example is an example that predicts the morphology and the film quality distribution of the film when the film is formed on the film formation surface on which a fine structure is formed. FIG. 9 is an explanatory diagram that describes the film formation on the film formation surface on which the fine structure is formed.

First, the following initial condition is set. The mixed gas of $SiH_4$ and $N_2$, or TEOS (tetraethyl orthosilicate: $Si(OC_2H_5)_4$) gas is used as the raw material gas, and the flux of the gas particles is $10^{17}$ piece/cm$^2$·s. Also, the entrance of the gas particle is set isotropic within the range of ±90° from the vertically downward direction by using the random number of [0, 1]. Further, the film formation temperature is set at 400 K, and the film formation time is set at 10 seconds. Also, as illustrated in FIG. 9, trenches 53 of widths 200 nm and depths 500 nm are provided on the film formation surface of the film formation target 51. Note that the material of the film formation target 51 is Si.

The morphology and the film quality distribution of the film formed in the film formation target 51 provided with the trenches 53 can be calculated by modeling the morphology of the film by the two-dimensional voxel model of the size of 1 nm and calculating it in the same method as the first specific example, in the same way as the first specific example.

Third Specific Example

Figure 10:
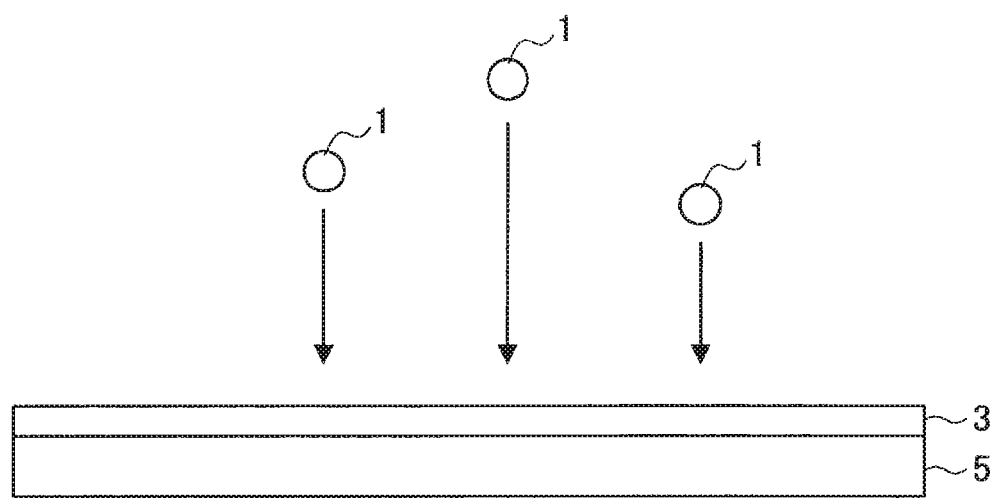
FIG. 10 is an explanatory diagram that describes an anisotropic film formation method.

Next, a third specific example will be described with reference to FIG. 10. The third specific example is an example that predicts the morphology and the film quality distribution of the film when the film is formed on the film formation surface by an anisotropic film formation method. FIG. 10 is an explanatory diagram that describes the anisotropic film formation method.

As illustrated in FIG. 10, in the anisotropic film formation method, the raw material particles 1 enter into the film formation target 5 in an entrance direction having a predetermined tendency, and form the film 3. For example, the raw material particles 1 may be projected on the film formation surface in the entrance directions having Gaussian distribution, with respect to a center at the vertical direction of the film formation surface. Note that the anisotropy in the entrance direction of the raw material particles 1 is not limited to the vertical direction of the film formation surface, but may be an oblique direction inclined from the film formation surface. Also, the distribution of the entrance directions of the raw material particles 1 may be a distribution other than the Gaussian distribution.

The anisotropic film formation method is, for example, a physical vapor deposition method (PVD), such as a resistance heating vapor deposition method, an electron beam vapor deposition method, a molecular beam epitaxy method, an ion plating method, and a sputtering method. The entrance direction of the raw material particles 1 can be controlled by the positional relationship between the supply source of the raw material particles 1 and the film formation target 5, for example.

Even in this case, according to the film formation simulation method according to the present embodiment, the morphology and the film quality distribution of the formed film can be calculated by using the same calculation method as the first specific example.

Fourth Specific Example

Figure 11:
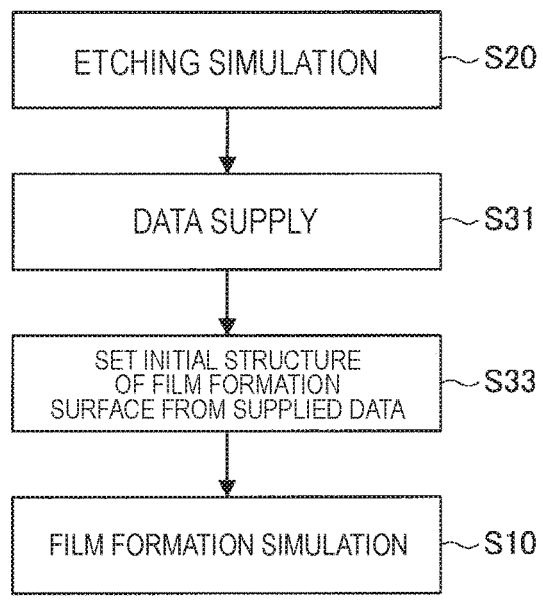
FIG. 11 is a flowchart diagram for describing a sequence of coordination between etching simulation and film formation simulation.
Figure 12A:
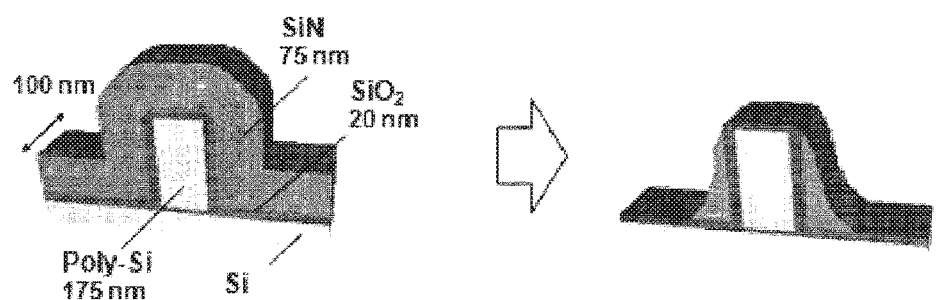
FIG. 12A is an image illustrating a simulation result of etching simulation.
Figure 12B:
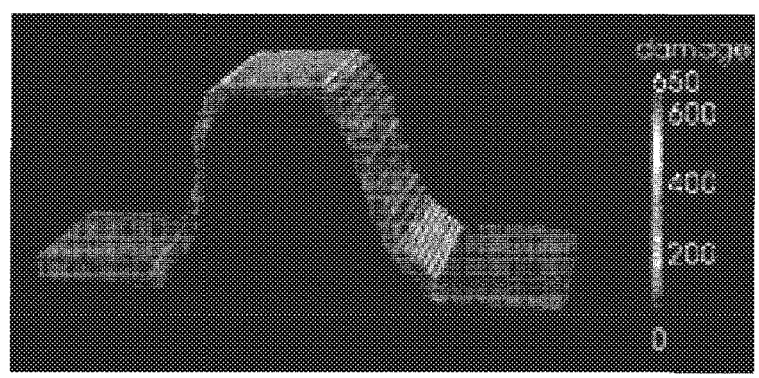
FIG. 12B is an image illustrating a simulation result of etching simulation.

Next, a fourth specific example will be described with reference to FIGS. 11 to 12B. The fourth specific example is an example that coordinates the etching simulation and the film formation simulation and predicts the morphology and the film quality distribution of the formed film in consideration of the damage to the film formation surface by etching. FIG. 11 is a flowchart diagram for describing the sequence of the coordination between the etching simulation and the film formation to simulation. FIGS. 12A and 12B are images indicating the simulation result of the etching simulation.

As illustrated in FIG. 11, in the fourth specific example, the result data of the simulation is supplied to the film formation simulation (S31), after the etching simulation (S20), Here, an initial structure of the film formation surface is set, by extracting the morphology and the film quality distribution (for example, defect density distribution, etc.) of the film formation surface after the etching, from the supplied data (S33). In the film formation simulation, the morphology and the film quality distribution of the formed film are calculated, by setting an initial condition of the film formation, in addition to the set initial structure of the film formation surface (S10).

According to this fourth specific example, the morphology and the film quality distribution of formed $SiO_2$ can be predicted more accurately, when a SiN layer formed on a Si layer and a $SiO_2$ layer is etched in a MOS (Metal-Oxide-Semiconductor) transistor, and side wall processing is performed, and thereafter $SiO_2$ is formed, as illustrated in FIG. 12A, for example.

Specifically, the film formation surface is damaged by the etching, and the defect increases. Also, the etching damage differs, depending on the material of the film formation surface. For example, as illustrated in FIG. 12B, the side wall of the inclined surface portion formed of SiN suffers small damage by the etching, and thus the defect density is low, but the upper surface and the bottom surface formed of $SiO_2$ suffer large damage by the etching, and thus the defect density becomes higher. When the defect density of the film formation surface differs, the activation energy differs. Thus, the morphology and the film quality distribution of the film formed on the film formation surface can be calculated more accurately, by receiving the defect density of the film formation surface from the etching simulation and performing the film formation simulation in consideration of the defect density of the film formation surface.

Note that the simulation result can be supplied from the film formation simulation to the etching simulation, as opposed to the fourth specific example. In this case, the progress degree of the etching, etc. can be predicted more accurately, by considering the difference in the film quality by the film formation.

2. Second Embodiment 2.1. Overview

Figure 13:
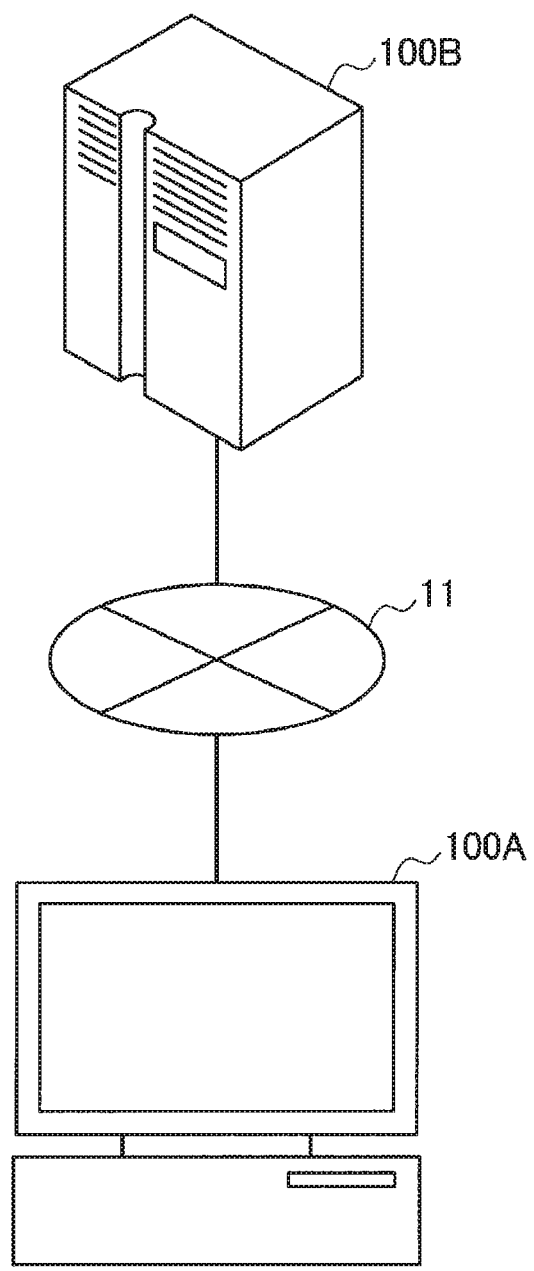
FIG. 13 is an explanatory diagram that describes an information processing apparatus that executes a program according to a second embodiment of the present disclosure.

Next, an overview of a program according to a second embodiment of the present disclosure will be described with reference to FIG. 13. FIG. 13 is an explanatory diagram that describes an information processing apparatus that executes the program according to the present embodiment.

The program according to the present embodiment is a program that executes the film formation simulation method according to the above first embodiment. The program according to the present embodiment is executed by an information processing apparatus 100A illustrated in FIG. 13, or a system including the information processing apparatus 100A and an information processing server 100B, for example.

The program according to the present embodiment is software in which a calculation engine that executes the calculation of the film formation simulation method according to the first embodiment is programmed. The program according to the present embodiment may be programmed by a programming language, such as C, $C^{++}$, Fortran, or JAVA (registered trademark), for example. Also, the present embodiment includes a storage medium that stores the software or computer program) in which the calculation engine that executes the calculation of the film formation simulation method according to the first embodiment is programmed.

The program according to the present embodiment may be executed in the information processing apparatus 100A, such as a computer, for example.

Also, the program according to the present embodiment may be executed by the cooperation of the information processing apparatus 100A and the information processing server 100B, for example. In this case, the execution speed of the film formation simulation can be improved, by causing the information processing server 100B of higher computing power to execute processing of a large calculation amount by the program according to the present embodiment.

Note that a network 11 that interconnects between the information processing apparatus 100A and the information processing server 100B may be a public line network such as the Internet, and may be a network that covers a limited narrow range such as a local area network (LAN). Also, the network 11 may be a wired network and may be a wireless network, if the network 11 can interconnect between the information processing apparatus 100A and the information processing server 100B.

2.2. Configuration Example of Film Formation Simulation Device

Figure 14:
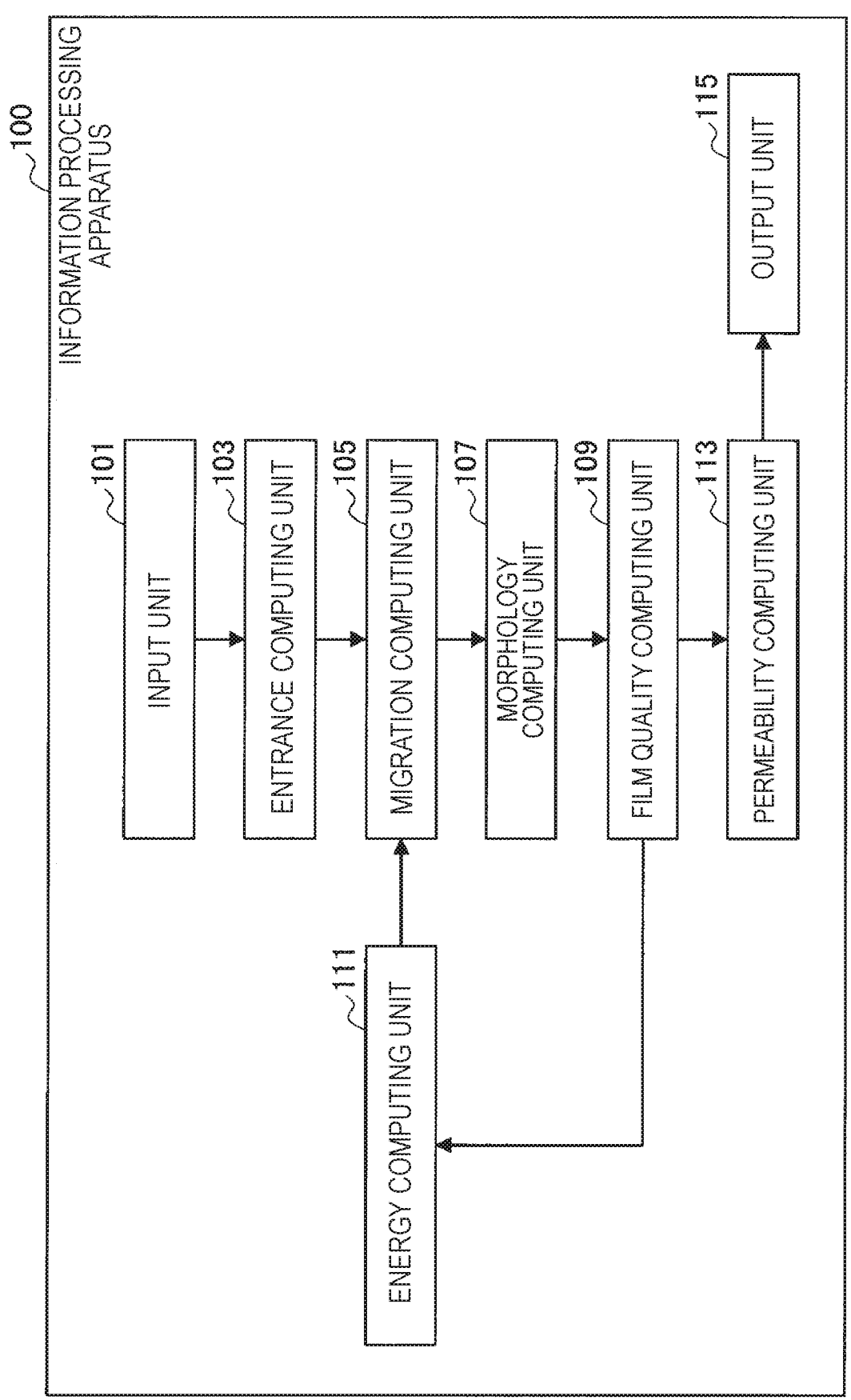
FIG. 14 is a block diagram that illustrates a functional configuration of an information processing apparatus that executes a program according to this embodiment.

Next, the configuration example of the information processing apparatus that executes the program according to the present embodiment will be described with reference to FIG. 14. FIG. 14 is a block diagram that illustrates a functional configuration of the information processing apparatus that executes the program according to the present embodiment. Note that FIG. 14 illustrates the information processing apparatus 100 that represents both of the information processing apparatus 100A of FIG. 13 and the system including the information processing apparatus 100A and the information processing server 100B of FIG. 13.

As illustrated in FIG. 14, the information processing apparatus 100 includes an input unit 101, an entrance computing unit 103, a migration computing unit 105, a morphology computing unit 107, a film quality computing unit 109, an energy computing unit 111, a permeability computing unit 113, and an output unit 115. Note that the execution platform of the information processing apparatus 100 that executes the program according to the present embodiment may be any of Windows (registered trademark), Linux (registered trademark), Unix (registered trademark), Mac OS (registered trademark), or OS X (registered trademark).

In the film formation simulation, the input unit 101 accepts an input of the initial condition of film formation, and supplies the input initial condition of film formation to the entrance computing unit 103. Specifically, information such as a film formation condition, a film formation device, various types of parameters used in calculation, structure data of a film formation surface, and a film thickness to be formed, is input into the input unit 101. The input unit 101 may be a graphical user interface (GUI) or the like displayed on a display device, for example. Also, the configuration language of the GUI may be any of OpenGL (registered trademark), Motif, tcl/tk, or the like.

The entrance computing unit 103 calculates the flux (i.e., the number of entering particles per unit time and unit area) of the raw material particles that enter into the film formation surface, on the basis of the input film formation condition. Specifically, the entrance computing unit 103 calculates the number, per unit time and unit area, of the raw material particles that enter into the film formation surface, on the basis of the flow rate of the entering gas, the film formation pressure, the bias voltage of the film formation surface, and the like. Also, the entrance computing unit 103 determines whether the entrance direction of the raw material particle is isotropic or anisotropic, and decides the entrance direction of the raw material particle.

The migration computing unit 105 calculates a position at which the raw material particle adheres ultimately, after the raw material particle adhered on the film formation surface migrates. Specifically, the migration computing unit 105 determines whether or not the raw material particle projected on the film formation surface adheres on the film formation surface, and calculates the migration positions of the raw material particle that adheres on the film formation surface. The specific calculation method executed by the migration computing unit 105 has been described in detail in the first embodiment, and therefore the description will be omitted here.

The morphology computing unit 107 calculates the morphology of the film formed of the raw material particles projected on the film formation surface. Specifically, the morphology computing unit 107 calculates the morphology of the formed film, on the basis of the migration positions of the projected raw material particles, when a predetermined amount of raw material particles are projected on the film formation surface. The specific calculation method executed by the morphology computing unit 107 has been described in detail in the first embodiment, and therefore the description will be omitted here.

The film quality computing unit 109 calculates the film quality distribution of the formed film, on the basis of the morphology of the film. Specifically, the film quality computing unit 109 calculates at least one of the density distribution or the defect density distribution of the film formed of the raw material particles, on the basis of the morphology of the film calculated by the morphology computing unit 107. The specific calculation method executed by the film quality computing unit 109 has been described in detail in the first embodiment, and therefore the description will be omitted here.

The energy computing unit 111 recalculates the activation energy of the surface of the formed film, on the basis of the film quality distribution of the formed film. Specifically, the energy computing unit 111 calculates the activation energy of the surface of the film formed of the predetermined amount of the raw material particles projected on the film formation surface, by using the detect density distribution of the film calculated by the film quality computing unit 109. Note that the calculated activation energy is input into the migration computing unit 105, and is used in the calculation of the subsequent migration positions of the raw material particles. The specific calculation method executed by the energy computing unit 111 has been described in detail in the first embodiment, and therefore the description will be omitted here.

The permeability computing unit 113 calculates the permeability of the formed film, on the basis of the film quality distribution of the formed film. Specifically, the permeability computing unit 113 calculates the permeability of the formed film, by using the film quality distribution (for example, void width distribution) of the film calculated by the film quality computing unit 109, after the imaginary film formation ends. The specific calculation method executed by the permeability computing unit 113 has been described in detail in the first embodiment, and therefore the description will be omitted here.

The output unit 115 outputs the morphology and the film quality distribution of the calculated film. Specifically, the output unit 115 may output, as the data file, the calculation result such as the morphology and the film quality distribution of the film, and may visualize the calculation result by an image or the like such as GUI and output the calculation result. The GUI configuration language may be any of OpenGL, Motif, tcl/tk, etc. Also, the output unit 115 may output the morphology and the film quality distribution of the calculated film at one time after the end of calculation, and may output the morphology and the film quality distribution of the calculated film in real time during the calculation. by executing the program according to the present embodiment, and can predict the film quality distribution of the film formed in the range of several micrometers.

2.3. Hardware Configuration

Figure 15:
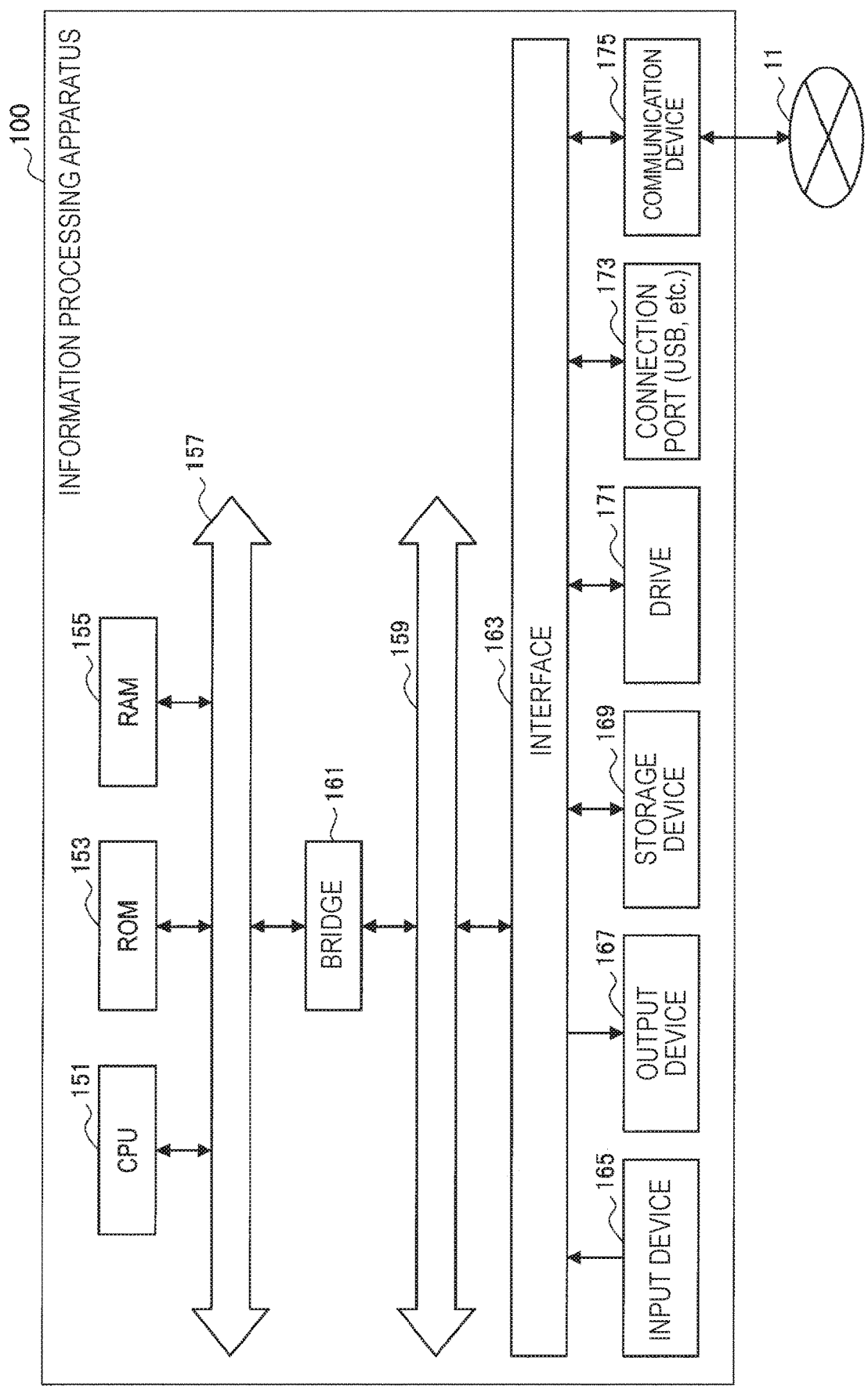
FIG. 15 is a block diagram that illustrates a hardware configuration example of an information processing apparatus that executes a program according to this embodiment.

Next, a hardware configuration of the information processing apparatus that executes the program according to the present embodiment will be described with reference to FIG. 15. The program according to the present embodiment implements the functional configuration illustrated in FIG. 14, by cooperating with the hardware illustrated in FIG. 15, in order to execute the film formation simulation method described in the first embodiment. FIG. 15 is a block diagram that illustrates a hardware configuration example of the information processing apparatus that executes the program according to the present embodiment.

As illustrated in FIG. 15, the information processing apparatus 100 includes a central processing unit (CPU) 151, a read only memory (ROM) 153, a random access memory (RAM) 155, a bridge 161, internal buses 157 and 159, an interface 163, an input device 165, an output device 167, a storage device 169, a drive 171, a connection port 173, and a communication device 175.

The CPU 151 functions as a computation processing device and a control device, and controls the overall operation of the information processing apparatus 100, in accordance with various types of programs (program according to the present embodiment, etc.) stored in the ROM 153 or the like. The ROM 153 stores the programs and the calculation parameters used by the CPU 151, and the RAM 155 temporarily stores the programs used in the execution of the CPU 151, and the parameters that changes as appropriate in the execution. For example, the CPU 151 may execute the functions of the entrance computing unit 103, the migration computing unit 105, the morphology computing unit 107, the film quality computing unit 109, the energy computing unit 111, the permeability computing unit 113, etc.

The CPU 151, the ROM 153, and the RAM 155 are connected to each other by the bridge 161, the internal buses 157 and 159, etc. Also, the CPU 151, the ROM 153, and the RAM 155 are connected to the input device 165, the output device 167, the storage device 169, the drive 171, the connection port 173 and the communication device 175 via the interface 163.

The input device 165 includes input means into which various types of information is input, such as a touch panel, a keyboard, a mouse, a button, a microphone, a switch, and a lever. Also, the input device 165 includes an input control circuit for generating an input signal on the basis of input or measured information and outputting the input signal to the CPU 151. For example, the input device 165 may execute the function of the input unit 101.

The output device 167 includes a display device such as a cathode ray tube (CRT) device, a liquid crystal display device, and an organic electroluminescence display device, and includes an audio output device such as a speaker and a headphone, for example. For example, the output device 167 may execute the function of the output unit 115 or the like.

The storage device 169 is a device for data storage configured as an example of the storage unit of the information processing apparatus 100. The storage device 169 may include a storage medium, a storage device that stores data in the storage medium, a readout device that reads out data from the storage medium, and a deleting device that deletes stored data.

The drive 171 is a storage medium reader-writer, and is provided inside or outside the information processing apparatus 100. For example, the drive 171 reads out the information stored in a removable storage medium, such as a set magnetic disk, an optical disc, a magneto-optical disk, or a semiconductor memory, and outputs the information to the RAM 153. Also, the drive 171 can write the information into the removable storage medium.

The connection port 173 is a connection interface including a connection port for connecting an external connection device, such as a universal serial bus (USB) port, an Ethernet (registered trademark) port, an IEEE802.11 standard port, and an optical audio terminal, for example.

The communication device 175 is a communication interface configured with a communication device or the like for connecting to the network 11, for example. Also, the communication device 175 may be a cable communication device that performs wired cable communication, and may be a wired or wireless LAN compatible communication device.

As described above, according to the program according to the present embodiment, the film formation simulation method according to the first embodiment can be executed by the computation processing device.

3. Third Embodiment

3.1. Overview

Figure 16:
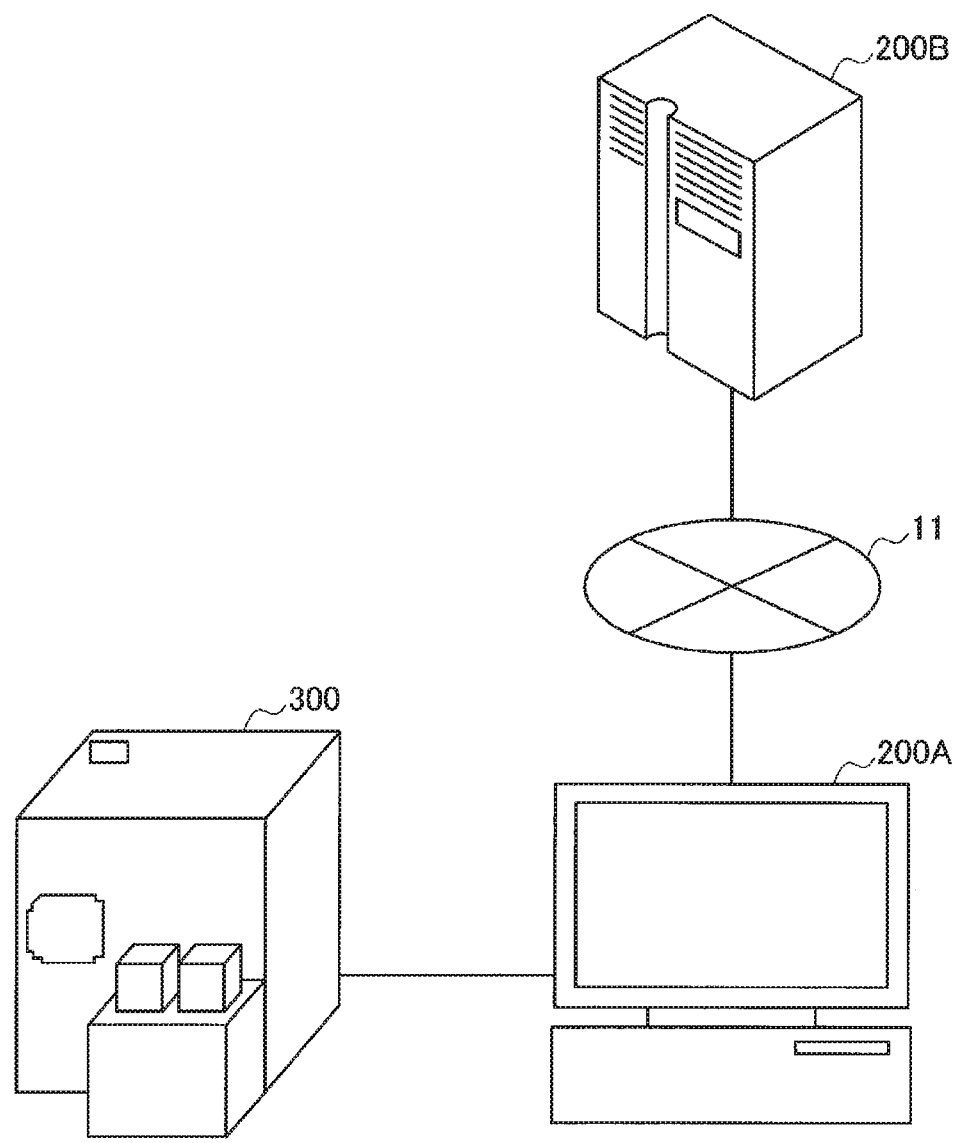
FIG. 16 is an explanatory diagram that describes an overview of a semiconductor processing system according to a third embodiment of the present disclosure.

Next, an overview of the semiconductor processing system according to a third embodiment of the present disclosure will be described with reference to FIG. 16. FIG. 16 is an explanatory diagram that describes the overview of the semiconductor processing system according to the present embodiment.

As illustrated in FIG. 16, the semiconductor processing system according to the present embodiment includes a semiconductor processing device 300, an information processing apparatus 200A that can execute the film formation simulation method according to the first embodiment, or a system including the information processing apparatus 200A and an information processing server 200B. The semiconductor processing system according to the present embodiment is a semiconductor processing system that corrects the film formation condition as appropriate, in order to form a film that has desired film quality distribution, by using the film formation simulation method according to the above first embodiment.

The semiconductor processing device 300 is a film formation device. For example, the semiconductor processing device 300 may be a film formation device that generates plasma by capacitively coupled plasma (CCP) or the like and forms a film on the semiconductor by CVD or PVD.

The information processing apparatus 200A is a computer or the like, for example, and executes the film formation simulation method according to the first embodiment. Also, the information processing apparatus 200A may cause the information processing server 200B to execute a part of computation of the film formation simulation method according to the first embodiment. In this case, the information processing server 200B having a higher computing power is caused to execute processing of a large calculation amount, and thereby the execution speed of the film formation simulation is improved. Note that the network 11 that connects the information processing apparatus 200A and the information processing server 200B is the same as the second embodiment, and thus the description will be omitted here.

3.2. Configuration Example of Semiconductor Processing System

Figure 17:
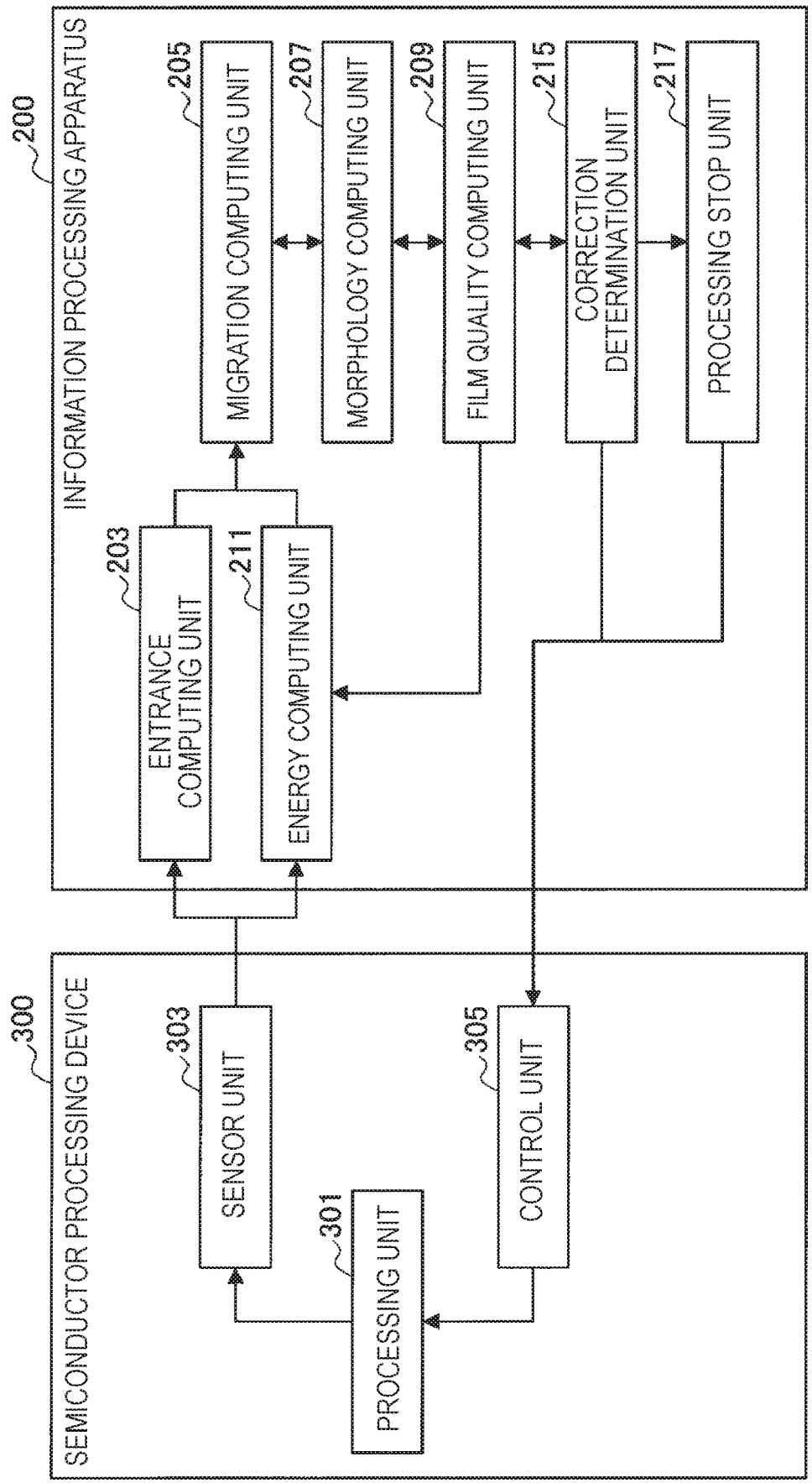
FIG. 17 is a block diagram that illustrates a functional configuration of a semiconductor processing system according to this embodiment.

Next, a configuration example of the semiconductor processing system according to the present embodiment will be described with reference to FIG. 17. FIG. 17 is a block diagram that illustrates the functional configuration of the semiconductor processing system according to the present embodiment. Note that FIG. 17 illustrates the information processing apparatus 200 that represents both of the information processing apparatus 200A of FIG. 16 and the system including the information processing apparatus 200A and the information processing server 200B of FIG. 16.

As illustrated in FIG. 17, the semiconductor processing device 300 includes a processing unit 301, a sensor unit 303, and a control unit 305. Also, the information processing apparatus 200 includes an entrance computing unit 203, a migration computing unit 205, a morphology computing unit 207, a film quality computing unit 209, a correction determination unit 215, and a processing stop unit 217.

Semiconductor Processing Device 300

The processing unit 301 is a processing chamber in which the film formation is performed. For example, the processing unit 301 forms a film on the film formation target by ionizing the raw material gas by plasma or the like under high vacuum and projecting the ionized raw material gas particles to the film formation target. However, the film formation method of the processing unit 301 is not limited particularly, if the method projects the raw material particles to forms a film as described in the first embodiment.

The sensor unit 303 acquires information regarding the state of the film formation in the processing unit 301. Specifically, the sensor unit 303 measures the information regarding the state of the atmosphere inside the processing unit 301 measured by sensors included in the processing unit 301 and the state of the film formation target, and supplies the measured information to the information processing apparatus 200. For example, the sensors included in the processing unit 301 may be an optical emission spectrometer (Optical Emission Spectrometry: OES), a mass spectrometer (Quadrupole SpectroMetry: QMS), an absorption spectrometer (Infrared Laser Absorption Spectroscopy: IRLAS), an energy spectrum analyzer, or the like. Also, the sampling of the measurement result by the sensor unit 303 may be performed at 0.1 second intervals, for example.

The control unit 305 controls the film formation condition in the processing unit 301. Specifically, when receiving a correction condition for correcting the film formation condition from the information processing apparatus 200, the control unit 305 controls the film formation condition in the processing unit 301, on the basis of the received correction condition. Also, when receiving a processing stop instruction from the information processing apparatus 200, the control unit 305 stops the film formation in the processing unit 301. With the control unit 305, the film formation simulation result in the information processing apparatus 200 can be reflected to the processing unit 301.

Information Processing Apparatus 200

The entrance computing unit 203 calculates the flux (i.e., the number of entering particles per unit time and unit area) of the raw material particles that enter the film formation surface, on the basis of the information regarding the state of the film formation measured by the sensor unit 303. Specifically, the entrance computing unit 203 calculates the flux of the raw material particles that enter the film formation surface, on the basis of the information regarding the state of the atmosphere inside the processing unit 301. For example, when the film formation method is the CVD, the entrance computing unit 203 may calculate the flux of the raw material particles that enter the film formation surface, by using the gas flow rate is into the chamber of the processing unit 301, and the state of the plasma.

The energy computing unit 211 calculates the activation energy of the surface of the film formation surface, on the basis of the information regarding the state of the film formation measured by the sensor unit 303. Specifically, the energy computing unit 211 calculates the activation energy of the surface of the film formation surface, on the basis of the information regarding the state of the film formation target. Also, the energy computing unit 211 recalculates the activation energy of the surface of the film formation surface, on the basis of the calculated film quality distribution of the film, when the film quality distribution of the formed film is calculated by the film quality computing unit 209 of the subsequent stage. Thereby, the information processing apparatus 200 recalculates and updates the activation energy of the surface of the film formation surface as the film formation progresses, and thus can predict the film quality distribution more accurately.

The migration computing unit 205, the morphology computing unit 207, and the film quality computing unit 215 are substantially same as the migration computing unit 105, the morphology computing unit 107, and the film quality computing unit 115 described in the second embodiment, and thus respective description will be omitted. Note that the migration computing unit 205, the morphology computing unit 207, and the film quality computing unit 215 differ from the second embodiment in calculating the morphology and the film quality distribution of the formed film, on the basis of the film formation state in the processing unit 301 measured by the sensor unit 303.

The correction determination unit 215 determines presence or absence of necessity of the correction to the film formation condition, by comparing the film quality distribution of the film calculated by the film quality computing unit 209 and the desired film quality distribution, and when correcting the film formation condition, determines the correction condition. Specifically, when the film quality distribution of the film predicted on the basis of the film formation state inside the processing unit 301 differs from the desired film quality distribution, the correction determination unit 215 determines the correction condition for getting closer the film quality distribution of the formed film to the desired film quality distribution. For example, when the film formation method is CVD, and the predicted number of defects of the film increases by 50% or more from the desired number of defects ($3 \times 10^{10}$ piece/cm$^2$), the correction determination unit 215 changes, by ±50%, the film formation condition in the order of the flow rate, the film formation pressure, the film formation temperature, the film formation power etc. of the raw material gas, and again causes the migration computing unit 205, the morphology computing unit 207, and the film quality computing unit 215 to execute the calculation of the film quality distribution. Thereby, the correction determination unit 215 determines the correction condition in which the number of defects is smaller than the desired number of defects.

Note that the film formation time is short, and thus when it is difficult to perform the film formation simulation by changing the film formation condition and determine the correction condition, the information processing apparatus 200 may prepare in advance a database obtained by performing perturbation calculation to various film formation condition, for example. The correction determination unit 215 can extract an appropriate condition from the database as the correction condition, by searching the database.

The correction condition determined by the correction determination unit 215 is transmitted to the control unit 305 of the semiconductor processing device 300, and thereby is reflected in the film formation in the processing unit 301.

The processing stop unit 217 stops the film formation in the semiconductor processing device 300, when it is determined that the film having the desired film quality distribution is unable to be formed. Specifically, when the film quality distribution of the film calculated by the film quality computing unit 209 largely differs from the desired film quality distribution, and the correction determination unit 215 determines that the correction condition for forming the desired film quality distribution is unable to be found, the processing stop unit 217 stops the film formation in the semiconductor processing device 300. The processing stop unit 217 may be FDC/EES (Fault Detection and Classification/Equipment Engineering System) or the like, for example. With the processing stop unit 217, when the film having the desired film quality distribution is unable to be formed, an error is dealed with promptly, by stopping the semiconductor processing device 300 promptly. Also, the search efficiency of the film formation condition for forming the film having the desired film quality distribution is improved.

The semiconductor processing system according to the present embodiment can efficiently build a processing condition of the film formation, the etching, and the like for forming the film having the desired film quality. Note that, in the above, the present embodiment has been described as the system including the semiconductor processing device 300 and the information processing apparatus 200, but the technology according to the present disclosure is not limited to this illustration. For example, the present embodiment may be a semiconductor processing device in which the semiconductor processing device 300 and the information processing apparatus 200 are integrated.

4. Conclusion

As described in detail above, according to the film formation simulation method according to the first embodiment of the present disclosure, it is possible to predict the film quality distribution, such as the density distribution, the defect density distribution, and the permeability of the film, in the region range of micrometer, in consideration of the film formation condition and the condition of the film formation surface.

Also, the film formation simulation method according to the first embodiment of the present disclosure recalculates the activation energy on the basis of the film quality distribution, in each time step, and calculates the migration positions of the raw material particles in consideration of the change of the film quality distribution during the film formation. Thus, according to the film formation simulation method according to the first embodiment of the present disclosure, the calculation accuracy of the morphology of the formed film is improved.

Also, by coordinating with the etching simulation that uses the same model, the film formation simulation method according to the first embodiment of the present disclosure can perform the prediction of the film quality distribution in a series of processes from the film formation to the etching, or from the etching to the film formation.

Also, the program according to the second embodiment of the present disclosure can efficiently execute the prediction of the film quality distribution, by causing the information processing apparatus to execute the computation processing of the film formation simulation method according to the first embodiment of the present disclosure.

Further, the semiconductor processing system according to the third embodiment of the present disclosure can efficiently build the processing condition of the film formation, the etching, and the like for forming the film having the desired film quality.

The preferred embodiment(s) of the present disclosure has/have been described above with reference to the accompanying drawings, whilst the present disclosure is not limited to the above examples. A person skilled in the art may find to) various alterations and modifications within the scope of the appended claims, and it should be understood that they will naturally come under the technical scope of the present disclosure.

Further, the effects described in this specification are merely illustrative or is exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A film formation simulation method including:

calculating a position at which each of raw material particles that enter a film formation surface migrates on the film formation surface, on a basis of an activation energy of a surface of the film formation surface, by using a computing device;

calculating information regarding a defect of a film including the raw material particles on the film formation surface, on a basis of migration positions of the raw material particles of a predetermined amount, each time the migration positions of the raw material particles of the predetermined amount are calculated; and calculating an activation energy of a surface of the film including the raw material particles, on a basis of the information regarding the defect of the film, in which the activation energy of the surface of the film calculated immediately before is used in calculation of the migration position of each of the raw material particles.

(2)

The film formation simulation method according to (1), in which the information regarding the defect of the film at least includes information indicating a void width distribution of the film including the raw material particles.

(3)

The film formation simulation method according to (1) or (2), in which the raw material particles adhere on the film formation surface at a predetermined probability, and the migration positions on the film formation surface are calculated for the adhering raw material particles.

(4)

The film formation simulation method according to any one of (1) to (3), in which information regarding a film formation condition is further used in the calculation of the migration position of each of the raw material particles.

(5)

The film formation simulation method according to any one of (1) to (4), in which the raw material particles are of two or more types, and the activation energy independent in each type of the raw material particles is used in the calculation of the migration position of each of the raw material particles.

(6)

The film formation simulation method according to any one of (1) to (5), in which the raw material particles enter the film formation surface isotropically or anisotropically.

(7)

The film formation simulation method according to any one of (1) to (6), in which the raw material particles are modeled in one of a quadrangular shape, a circular shape, a spherical shape, and a cube shape.

(8)

The film formation simulation method according to any one of (1) to (7), in which the migration position of the raw material particle is calculated by using a Monte Carlo method in a predetermined region from an adherence position of the raw material particle on the film formation surface.

(9)

The film formation simulation method according to (8), in which the migration position of the raw material particle is a surface position having a concave shape closest from the adherence position of the raw material particle on the film formation surface.

(10)

The film formation simulation method according to any one of (1) to (7), in which the migration position of the raw material particle is a position at which an energy of the raw material particle is equal to or smaller than a threshold value, when the raw material particle is moved at random.

(11)

The film formation simulation method according to (10), in which the raw material particle acquires an energy based on a film formation temperature and loses an energy based on the activation energy at a position after movement, for each movement.

(12)

A program for causing a computer to function as:

a migration computing unit that calculates a position at which each of raw material particles that enter a film formation surface migrates on the film formation surface, on a basis of an activation energy of a surface of the film formation surface;

a morphology computing unit that calculates information regarding a defect of a film including the raw material particles on the film formation surface, on a basis of migration positions of the raw material particles of a predetermined amount, each time the migration positions of the raw material particles of the predetermined amount are calculated by the migration computing unit; and an energy computing unit that calculates an activation energy of a surface of the film including the raw material particles, on a basis of the information regarding the defect of the film, in which the migration computing unit uses the activation energy of the surface of the film calculated immediately before by the energy computing unit.

(13)

A semiconductor processing system including:

a migration computing unit that calculates a position at which each of raw material particles that enter a film formation surface migrates on the film formation surface, on a basis of an activation energy of a surface of the film formation surface;

a morphology computing unit that calculates information regarding a defect of a film including the raw material particles on the film formation surface, on a basis of migration positions of the raw material particles of a predetermined amount, each time the migration positions of the raw material particles of the predetermined amount are calculated; and an energy computing unit that calculates an activation energy of a surface of the film including the raw material particles, on a basis of the information regarding the defect of the film, in which the migration computing unit uses the activation energy of the surface of the film calculated immediately before by the energy computing unit.

(14)

The semiconductor processing system according to (13), further including:

a sensor unit that measures a film formation state;

a correction determination unit that determines a correction condition for correcting a film formation condition, on a basis of a difference between a film quality of the film calculated by using information measured by the sensor unit and a desired film quality; and a control unit that controls the film formation condition on a basis of the correction condition.

(15)

The semiconductor processing system according to (14), further including a processing stop unit that stops film formation when the correction determination unit is unable to determine the correction condition.

(16)

A film formation simulation method including:

calculating a position at which each of raw material particles that enter a film formation surface migrates on the film formation surface, on a basis of an activation energy of a surface of the film formation surface, by using a computing device;

calculating information regarding a detect of a film including the raw material particles, on a basis of the migration position of each of the raw material particles; and calculating a film quality distribution of the film including the raw material particles, on a basis of the information regarding the defect of the film.

(17)

The film formation simulation method according to (16), in which the film quality distribution includes at least one of a density distribution of the film and a defect density distribution of the film.

(18)

The film formation simulation method according to (16) or (17), in which the film quality distribution is calculated by using a function or a database set in advance.

(19)

The film formation simulation method according to any one of (16) to (18), in which the raw material particles are of two or more types, and information regarding the raw material particles is a composition ratio of the raw material particles.

(20)

A film formation simulation method including:

calculating a position at which each of raw material particles that enter the film formation surface migrates on a film formation surface, on a basis of activation energy of a surface of the film formation surface, by using a computing device;

calculating information regarding a defect of a film including the raw material particles, on a basis of the migration position of each of the raw material particles;

calculating a void width distribution of the entire formed film, on a basis of the information regarding the defect of the film; and calculating a permeability of the entire formed film, on a basis of the void width distribution.

(21)

The film formation simulation method according to (20), in which the raw material particles are of two or more types, and the permeability is calculated further on a basis of a composition ratio of the raw material particles, and a film formation temperature.

REFERENCE SIGNS LIST 1 raw material particle
3 film
5 film formation target
7 void
100, 200 information processing apparatus
101 input unit
103, 203 entrance computing unit
105, 205 migration computing unit
107, 207 morphology computing unit
109, 209 film quality computing unit
111, 211 energy computing unit
113 permeability computing unit
115 output unit
215 correction determination unit
217 processing stop unit
300 semiconductor processing device
301 processing unit
303 sensor unit
305 control unit

The invention claimed is:

1. A film formation simulation method, comprising:

calculating, using a computing device, a position at which each raw material particle entering a film formation surface migrates on the film formation surface, on a basis of an activation energy of a surface of the film formation surface;

calculating, using the computing device, information regarding a defect in a film formed by the raw material particles on the film formation surface, on a basis of migration positions of the raw material particles of a predetermined amount, each time the migration positions of the raw material particles of the predetermined amount are calculated; and calculating, by the computing device, an activation energy of a surface of the film formed by the raw material particles, on a basis of the information regarding the defect in the film, wherein the activation energy of the surface of the film calculated immediately before is used in calculation of the migration position of each of the raw material particles.

2. The film formation simulation method according to claim 1, wherein the information regarding the defect in the film at least includes information indicating a void width distribution of the film formed by the raw material particles.

3. The film formation simulation method according to claim 1, wherein the raw material particles adhere on the film formation surface at a predetermined probability, and the migration positions of the raw material particles on the film formation surface are calculated for the adhering raw material particles.

4. The film formation simulation method according to claim 1, wherein information regarding a film formation condition is further used in the calculation of the migration position of each of the raw material particles.

5. The film formation simulation method according to claim 1, wherein the raw material particles are of two or more types, and the activation energy independent in each type of the raw material particles is used in the calculation of the migration position of each of the raw material particles.

6. The film formation simulation method according to claim 1, wherein the raw material particles enter the film formation surface isotropically or anisotropically.

7. The film formation simulation method according to claim 1, wherein the raw material particles are modeled in one of a quadrangular shape, a circular shape, a spherical shape, and a cube shape.

8. The film formation simulation method according to claim 1, wherein the migration position of each of the raw material particles is calculated by using a Monte Carlo method in a predetermined region from an adherence position of each of the raw material particles on the film formation surface.

9. The film formation simulation method according to claim 8, wherein the migration position of each of the raw material particles is a surface position having a concave shape closest from the adherence position of the raw material particle on the film formation surface.

10. The film formation simulation method according to claim 1, wherein the migration position of each of the raw material particles is a position at which an energy of the raw material particle is equal to or smaller than a threshold value, when the raw material particle is moved at random.

11. The film formation simulation method according to claim 10, wherein each of the raw material particles acquires energy based on a film formation temperature and loses energy based on the activation energy at a position after movement, for each movement.

12. The film formation simulation method according to claim 1, wherein the film has a thickness of several micrometers.

13. A non-transitory program for causing a computer to function as:

a migration computing unit that calculates a position at which each raw material particle entering a film formation surface migrates on the film formation surface, on a basis of an activation energy of a surface of the film formation surface;

a morphology computing unit that calculates information regarding a defect in a film formed by the raw material particles on the film formation surface, on a basis of migration positions of the raw material particles of a predetermined amount, each time the migration positions of the raw material particles of the predetermined amount are calculated by the migration computing unit; and an energy computing unit that calculates an activation energy of a surface of the film formed by the raw material particles, on a basis of the information regarding the defect in the film, wherein the migration computing unit uses the activation energy of the surface of the film calculated immediately before by the energy computing unit.

14. The non-transitory program according to claim 13, wherein the film has a thickness of several micrometers.

15. The non-transitory program according to claim 13, wherein the information regarding the defect in the film at least includes information indicating a void width distribution of the film formed by the raw material particles.

16. A semiconductor processing system, comprising:
a migration computing unit that calculates a position at which each raw material particle entering a film formation surface migrates on the film formation surface, on a basis of an activation energy of a surface of the film formation surface;
a morphology computing unit that calculates information regarding a defect in a film formed by the raw material particles on the film formation surface, on a basis of migration positions of the raw material particles of a predetermined amount, each time the migration positions of the raw material particles of the predetermined amount are calculated; and
an energy computing unit that calculates an activation energy of a surface of the film formed by the raw material particles, on a basis of the information regarding the defect in the film, wherein the migration computing unit uses the activation energy of the surface of the film calculated immediately before by the energy computing unit.

17. The semiconductor processing system according to claim 16, further comprising:
a sensor unit that measures a film formation state;
a correction determination unit that determines a correction condition for correcting a film formation condition, on a basis of a difference between a film quality of the film calculated by using information measured by the sensor unit and a desired film quality; and
a control unit that controls the film formation condition on a basis of the correction condition.

18. The semiconductor processing system according to claim 17, further comprising:
a processing stop unit that stops film formation when the correction determination unit is unable to determine the correction condition.

19. The semiconductor processing system according to claim 16, wherein the film has a thickness of several micrometers.

20. The semiconductor processing system according to claim 16, wherein the information regarding the defect in the film at least includes information indicating a void width distribution of the film formed by the raw material particles.

* * * * *